United States Patent
Cheng et al.

(12)

(10) Patent No.: US 10,367,076 B1
(45) Date of Patent: Jul. 30, 2019

(54) AIR GAP SPACER WITH CONTROLLED AIR GAP HEIGHT

(71) Applicant: International Business Machines Corporation, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/884,934

(22) Filed: Jan. 31, 2018

(51) Int. Cl.
| | |
|---|---|
| *H01L 29/76* | (2006.01) |
| *H01L 31/062* | (2012.01) |
| *H01L 29/66* | (2006.01) |
| *H01L 21/762* | (2006.01) |
| *H01L 29/06* | (2006.01) |
| *H01L 29/417* | (2006.01) |
| *H01L 29/78* | (2006.01) |
| *H01L 29/49* | (2006.01) |

(52) U.S. Cl.
CPC .... *H01L 29/6656* (2013.01); *H01L 21/76297* (2013.01); *H01L 29/0649* (2013.01); *H01L 29/41791* (2013.01); *H01L 29/4991* (2013.01); *H01L 29/66545* (2013.01); *H01L 29/66553* (2013.01); *H01L 29/66818* (2013.01); *H01L 29/7851* (2013.01); *H01L 2029/7858* (2013.01)

(58) Field of Classification Search
CPC ............. H01L 29/785; H01L 29/66795; H01L 29/0649; H01L 29/66545; H01L 29/41791; H01L 29/6656

USPC ......................................................... 257/401
See application file for complete search history.

(56) References Cited

U.S. PATENT DOCUMENTS

| | | |
|---|---|---|
| 7,741,663 B2 | 6/2010 | Hause et al. |
| 8,637,384 B2 | 1/2014 | Ando et al. |
| 9,252,233 B2 | 2/2016 | Hsiao et al. |
| 9,305,835 B2 | 4/2016 | Alptekin et al. |
| 9,368,572 B1 | 6/2016 | Cheng et al. |
| 9,515,156 B2 | 12/2016 | Besser et al. |
| 9,536,982 B1 | 1/2017 | Cheng et al. |

(Continued)

OTHER PUBLICATIONS

A. B. Sachid et al., "FinFET With Encased Air-Gap Spacers for High-Performance and Low-Energy Circuits," IEEE Electron Device Letters, vol. 38, No. 1, 2017, pp. 16-19.

(Continued)

*Primary Examiner* — Theresa T Doan
(74) *Attorney, Agent, or Firm* — Cantor Colburn LLP; Vazken Alexanian

(57) ABSTRACT

A FinFET and method for fabricating an air gap spacer in a FinFET is disclosed. The FinFET includes a sidewall spacer between a gate material and an interlayer dielectric material. The sidewall spacer includes a lower portion that extends fully between the gate and the interlayer dielectric material and an upper portion that includes an airgap. The sidewall spacer is fabricated by depositing a sacrificial gate structure in a gate region having an upper sacrificial layer and a lower sacrificial layer, and removing the upper sacrificial layer to expose a sidewall spacer region. Airgap spacer material is deposited in the exposed sidewall spacer region to form an upper portion of the sidewall spacer having the air gap.

15 Claims, 62 Drawing Sheets

(56) References Cited

U.S. PATENT DOCUMENTS

2012/0276711 A1    11/2012  Yoon et al.
2016/0329341 A1*   11/2016  Shimabukuro ... H01L 27/11582
2018/0204927 A1*    7/2018  Chanemougame ..........................
                                                      H01L 29/4991

OTHER PUBLICATIONS

K Cheng et al., "Air spacer for 10nm FinFET CMOS and beyond." International Electron Devices Meeting, IEDM 2016, 17.1, 4 pages.

* cited by examiner

US 10,367,076 B1

AIR GAP SPACER WITH CONTROLLED AIR GAP HEIGHT

BACKGROUND

The present invention relates generally to semiconductor fabrication and, more specifically, to a method of fabricating a transistor having an air gap spacer at a controlled air gap height.

A Fin-type Field Effect Transistor, also known as a FinFET, is a type of non-planar or "3D" transistor used in the design of modern processors. As in earlier, planar designs, it can be built on an SOI (silicon on insulator) substrate. However, FinFET designs also use a conducting channel that rises above the level of the insulator, creating a thin silicon structure, shaped like a fin. A gate electrode is wrapped around sidewalls of the fin such that the portion of the fin that is under the gate electrode functions as the transistor's channel, and the portions of the fin that are not under the gate electrode function as the source and drain regions. Multiple gates can be wrapped around the fin-shaped channel.

Gate electrodes of a FinFET are isolated from source and drain electrodes by a spacer material formed as a sidewall to the gate. In order to reduce capacitance between gate and source or between gate and drain, it is desirable to have a sidewall spacer material, such as air, that has a low-k value in a region of the sidewall. It can be difficult to fabricate FinFETs having such air-filled sidewalls.

SUMMARY

Embodiments of the present invention are directed to a method for fabricating an air gap spacer in a FinFET. A non-limiting example of the method includes depositing a sacrificial gate structure in a gate region, the sacrificial gate structure having an upper sacrificial layer and a lower sacrificial layer; removing the upper sacrificial layer to expose a sidewall spacer region; and depositing an airgap spacer material in the exposed sidewall spacer region to form an upper portion of a sidewall spacer, the upper portion having the air gap.

Additional embodiments of the present invention are directed to a method for fabricating a FinFET. A non-limiting example of the method includes depositing a sacrificial gate structure to mark a gate region of the FinFET, the sacrificial gate structure having an upper sacrificial layer and a lower sacrificial layer; removing the upper sacrificial layer to expose an upper portion of a sidewall spacer; removing the upper portion of the sidewall spacer; and depositing an air gap spacer material in a region vacated by removal of the upper portion of the sidewall spacer.

Additional embodiments of the present invention are directed a FinFET. A non-limiting example of the FinFET includes a gate material; an interlayer dielectric material to one side of the gate material; and a sidewall spacer between the gate material and the interlayer dielectric material, the sidewall spacer including a lower portion that extends fully between the gate and the interlayer dielectric material and an upper portion that includes an airgap.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the fabrication of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, semiconductor devices are typically formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

Figure 1:
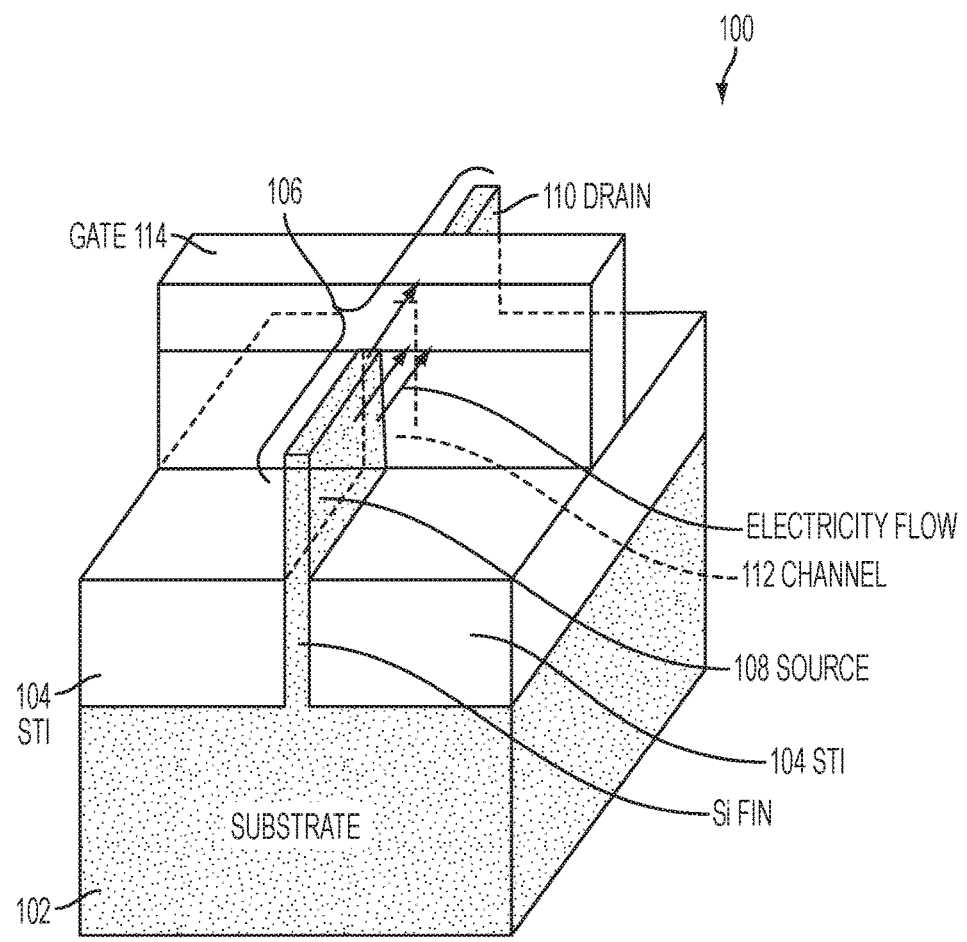
FIG. 1 depicts a three-dimensional view of an example configuration of a known FinFET device.

One particularly advantageous type of MOSFET is known generally as a fin-type field effect transistor (FinFET), an example of which is shown in FIG. 1 as a three-dimensional view of a FinFET 100. The basic electrical layout and mode of operation of FinFET 100 do not differ significantly from a traditional field effect transistor. FinFET 100 includes a semiconductor substrate 102, a shallow trench isolation (STI) layer 104, a fin 106 and a gate 114, configured and arranged as shown. Fin 106 includes a source region 108, a drain region 110 and a channel region 112, wherein gate 114 extends over the top and sides of channel region 112. For ease of illustration, a single fin is shown in FIG. 1. In practice, FinFET devices are fabricated having multiple fins formed on STI 104 and substrate 102. Substrate 102 can be silicon, STI 104 can be an oxide (e.g., Silicon oxide) and fin 106 can be silicon that has been enriched to a desired concentration level of germanium. Gate 114 controls the source to drain current flow (labeled ELECTRICITY FLOW in FIG. 1).

In contrast to planar MOSFETs, source 108, drain 110 and channel 112 are built as a three-dimensional bar on top of STI layer 104 and semiconductor substrate 102. The three-dimensional bar is the aforementioned "fin 106," which serves as the body of the device. The gate electrode is then wrapped over the top and sides of the fin, and the portion of the fin that is under the gate electrode functions as the channel. The source and drain regions are the portions of the fin on either side of the channel that are not under the gate electrode. The dimensions of the fin establish the effective channel length for the transistor.

The gate electrode of the FinFET is generally separated from the source and drain contacts by a sidewall spacer material having a low dielectric constant (i.e., low-k). Reducing the dielectric constant of the sidewall spacer material reduces the occurrence of a capacitance between the gate and source and/or between the gate and drain. In some FinFET, it is desirable to achieve a low-k by replacing the sidewall spacer material with a pocket of air between the gate and source and/or between the gate and drain. However, forming an air gap at these locations is a fabrication challenge. Accordingly, there is a need to fabricate FinFETs with an airgap sidewall spacer in order to reduce capacitance in the FinFET.

Turning now to an overview of the aspects of the invention, one or more embodiments of the invention address the above-described shortcomings of the prior art by providing a method for fabricating a FinFET having an airgap sidewall spacer between gate and drain and/or between gate and source. The method includes forming a sacrificial gate having an upper sacrificial layer and a lower sacrificial layer. The upper sacrificial layer is removed to expose an upper portion of a sidewall spacer that confines the sacrificial gate. The upper portion of the sidewall spacer is then removed and replaced with airgap sidewall spacer material. The lower portion of the sidewall spacer can be used as an etch stop for removing a temporary spacer material prior to depositing the airgap sidewall spacer material.

Figure 2A:
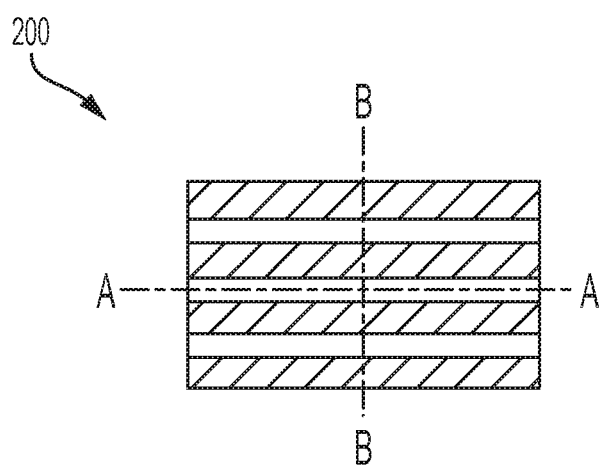
FIG. 2A provides a top-down view of the FinFET transistor as seen at or during an initial fabrication stage in which a fin of the FinFET is formed on a substrate.
Figure 2B:
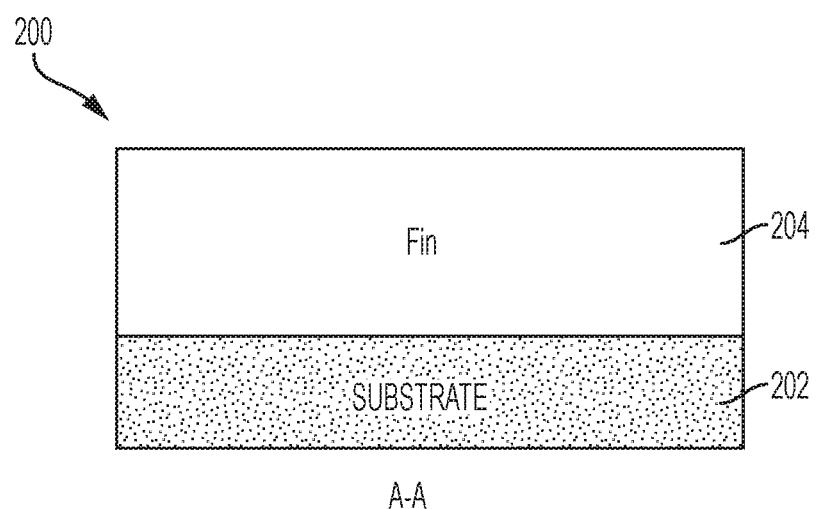
FIG. 2B shows a cross-gate view looking into a cross-section of the gate of the FinFET during the initial fabrication stage.
Figure 2C:
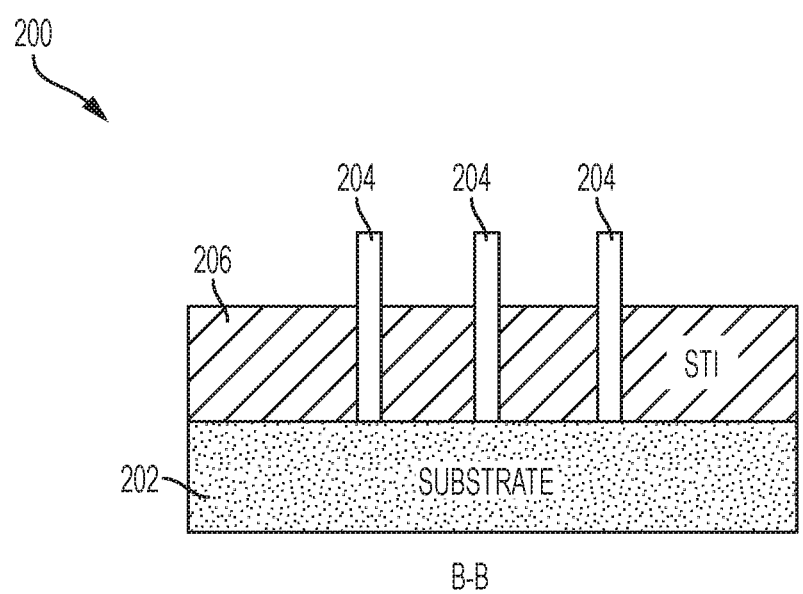
FIG. 2C shows a fin-aligned view looking into a cross-section perpendicular to the cross-section of FIG. 2B.

Turning now to FIGS. 2-19, a method of fabricating a FinFET transistor having a sidewall spacer that includes an air gap therein is generally shown in accordance with an embodiment. Different viewing angles of the FinFET fabrication stage are shown in associated figures. Using FIGS. 2A-C as an example, FIG. 2A provides a top-down view of the FinFET transistor as seen at or during the particular fabrication stage. The top-down view includes dotted lines A-A and B-B indicating vertical planes extending across a gate structure of the FinFET (i.e., parallel to the fins, line A-A) as well as across the fins of the FinFET (i.e., perpendicular to the fins, line B-B). FIG. 2B shows a side view looking into the cross-section made by the A-A vertical plane, forming a cross-gate view. FIG. 2C shows a side view looking into the cross-section made by the B-B vertical plane, which forms a fin-aligned view. FIGS. 3-18 similarly display top and side views of their associated fabrication stages.

Turning now to FIG. 2A, FIG. 2A shows a top-down view of an initial stage 200 of fabricating a FinFET transistor in which a fins of the FinFET is formed on a substrate 202. FIG. 2B shows a cross-gate view looking into a cross-section of the gate of the FinFET during the fabrication stage of FIG. 2A. FIG. 2C shows a fin-aligned view looking into a cross-section perpendicular to the cross-section of FIG. 2B. The substrate 202 can be formed of a suitable insulating material such as silicon dioxide. The fins 204 of the FinFET transistor can be made of silicon or other suitable material. A shallow trench isolate (STI) oxide layer 206 can be deposited to cover the substrate 202 to a depth that allows the tops of the fins to extend above the STI oxide layer 206.

Figure 3A:
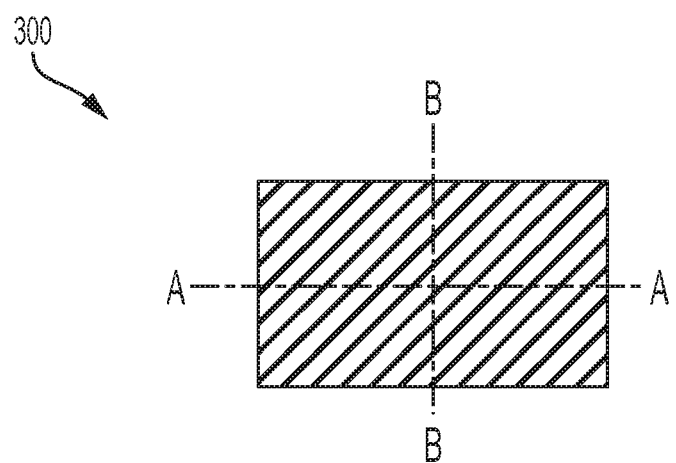
FIG. 3A provides a top-down view of the FinFET transistor as seen at or during a fabrication stage in which an oxide layer is deposited on top of an oxide layer from the initial fabrication stage and over the tops of the fins extending of the oxide layer.
Figure 3B:
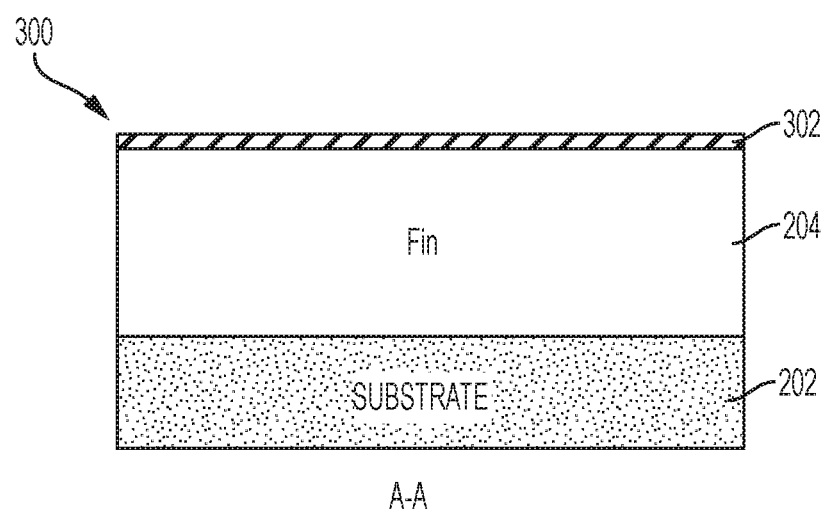
FIG. 3B shows a cross-gate view looking into a cross-section of the gate of the FinFET during the fabrication stage of FIG. 3A.
Figure 3C:
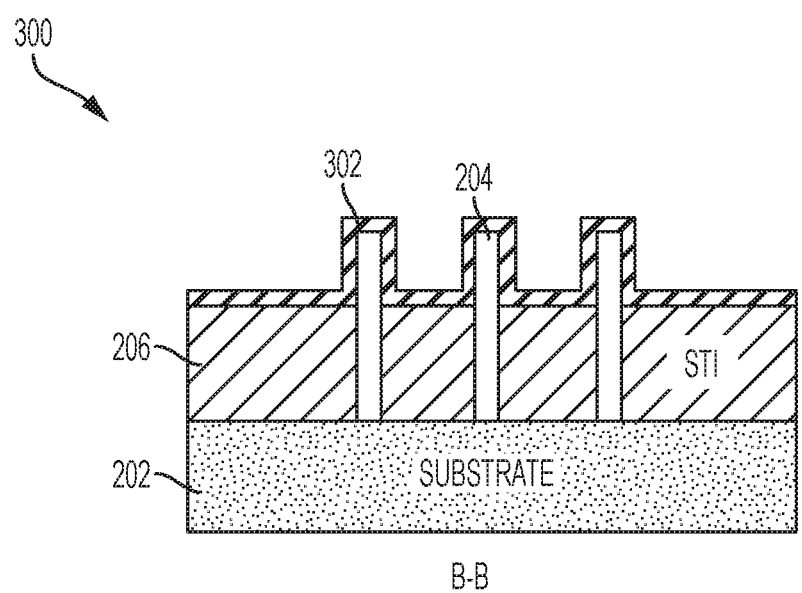
FIG. 3C shows a fin-aligned view looking into a cross-section perpendicular to the cross-section of FIG. 3B.

FIG. 3A shows a top-down view of a fabrication stage 300 in which an oxide layer 302 is deposited on top the STI oxide layer 206 and over the tops of the fins 204 extending above the STI oxide layer 206. FIG. 3B shows a cross-gate view looking into a cross-section of the gate of the FinFET during the fabrication stage of FIG. 3A. FIG. 3C shows a fin-aligned view looking into a cross-section perpendicular to the cross-section of FIG. 3B.

Figure 4A:
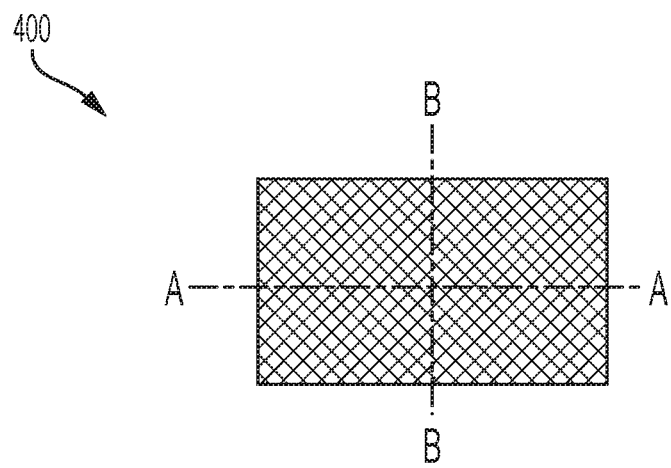
FIG. 4A shows a top-down view of a fabrication stage in which a poly-silicon material or amorphous silicon is deposited on top of the oxide layer.
Figure 4B:
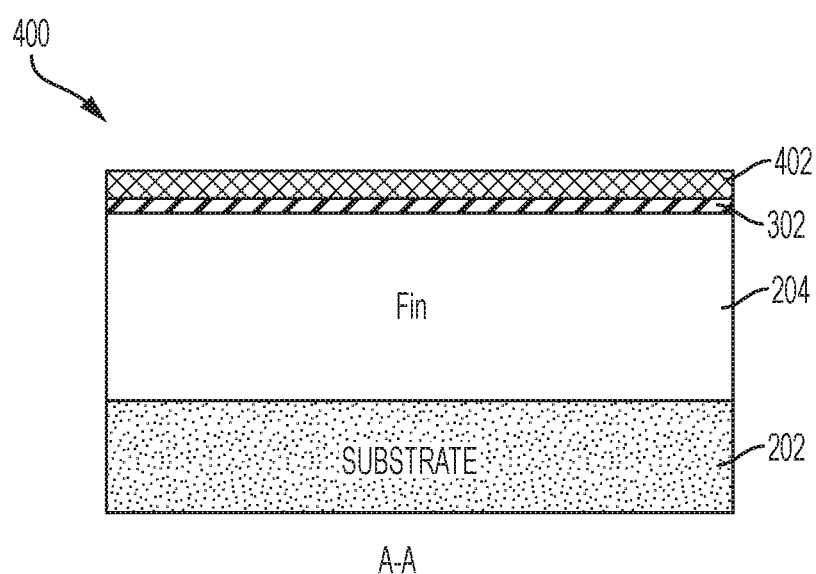
FIG. 4B shows a cross-gate view looking into a cross-section of the gate of the FinFET during the fabrication stage of FIG. 4A.
Figure 4C:
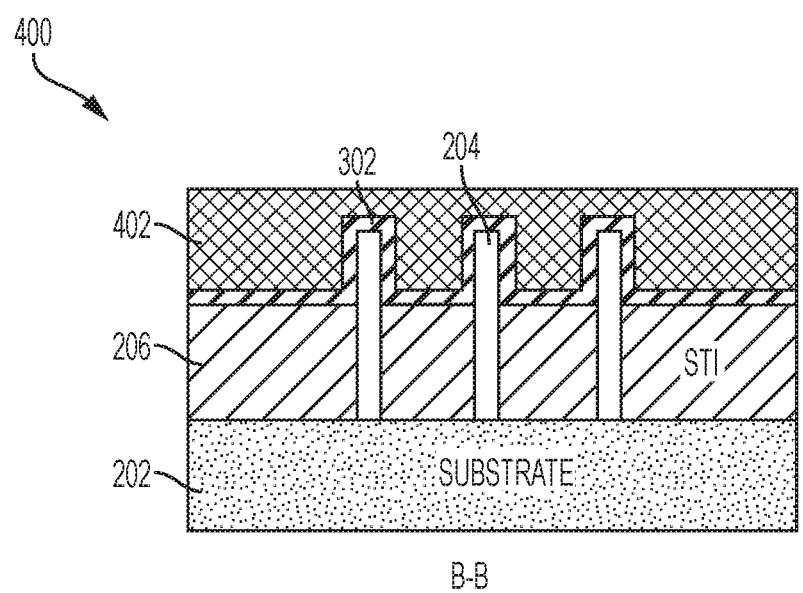
FIG. 4C shows a fin-aligned view looking into a cross-section perpendicular to the cross-section of FIG. 4B.

FIG. 4A shows a top-down view of a fabrication stage 400 in which a poly-silicon material or amorphous silicon 402 is deposited on top of the oxide layer 302. FIG. 4B shows a cross-gate view looking into a cross-section of the gate of the FinFET during the fabrication stage of FIG. 4A. FIG. 4C shows a fin-aligned view looking into a cross-section perpendicular to the cross-section of FIG. 4B. The amorphous silicon 402 can be deposited on top of the oxide layer 302 and then polished to a selected thickness using, for example, chemical mechanical polishing (CMP).

Figure 5A:
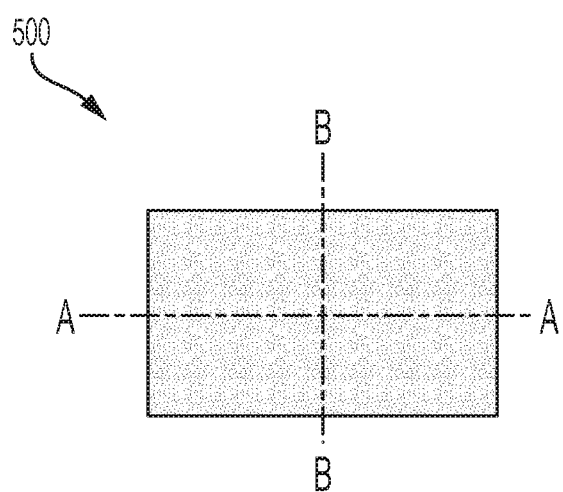
FIG. 5A shows a top-down view of a fabrication stage in which a silicon nitride layer 402 is deposited on the amorphous silicon.
Figure 5B:
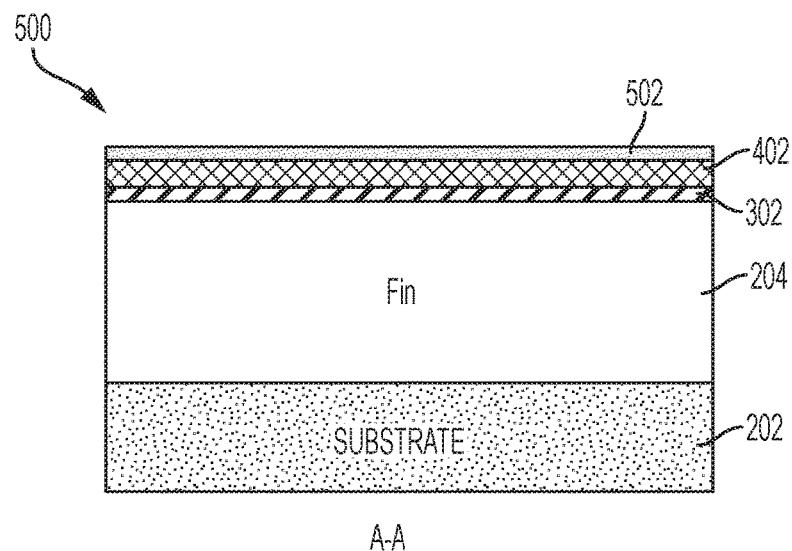
FIG. 5B shows a cross-gate view looking into a cross-section of the gate of the FinFET during the fabrication stage of FIG. 5A.
Figure 5C:
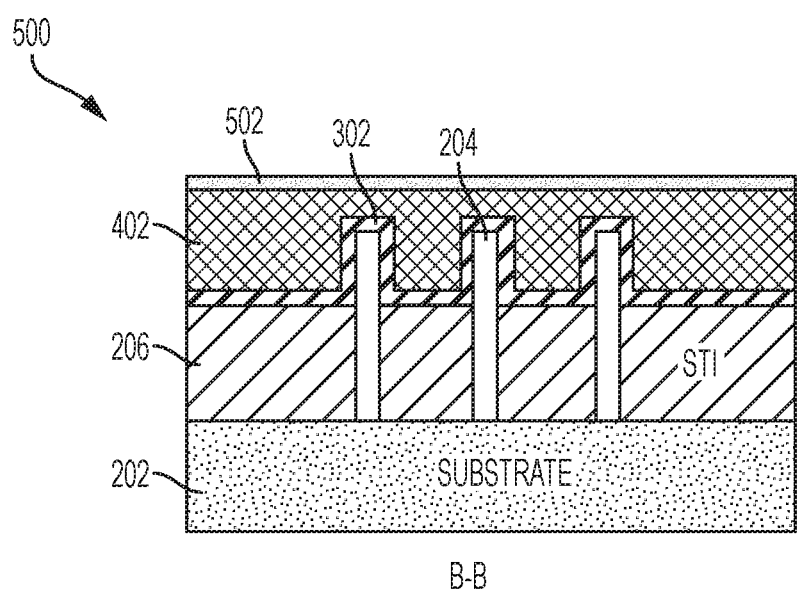
FIG. 5C shows a fin-aligned view looking into a cross-section perpendicular to the cross-section of FIG. 5B.

FIG. 5A shows a top-down view of a fabrication stage 500 in which a silicon nitride (SiNx) layer 502 is deposited on the amorphous silicon 402. FIG. 5B shows a cross-gate view looking into a cross-section of the gate of the FinFET during the fabrication stage of FIG. 5A. FIG. 5C shows a fin-aligned view looking into a cross-section perpendicular to the cross-section of FIG. 5B.

Figure 6A:
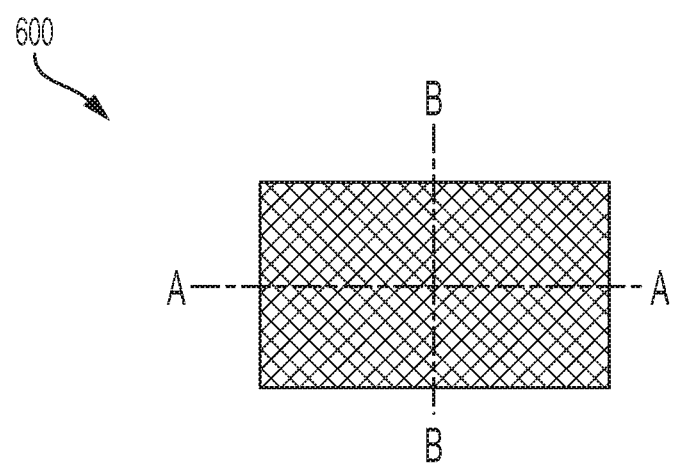
FIG. 6A shows a top-down view of a fabrication stage in which a poly-silicon material or amorphous silicon is deposited on top of the silicon nitride layer.
Figure 6B:
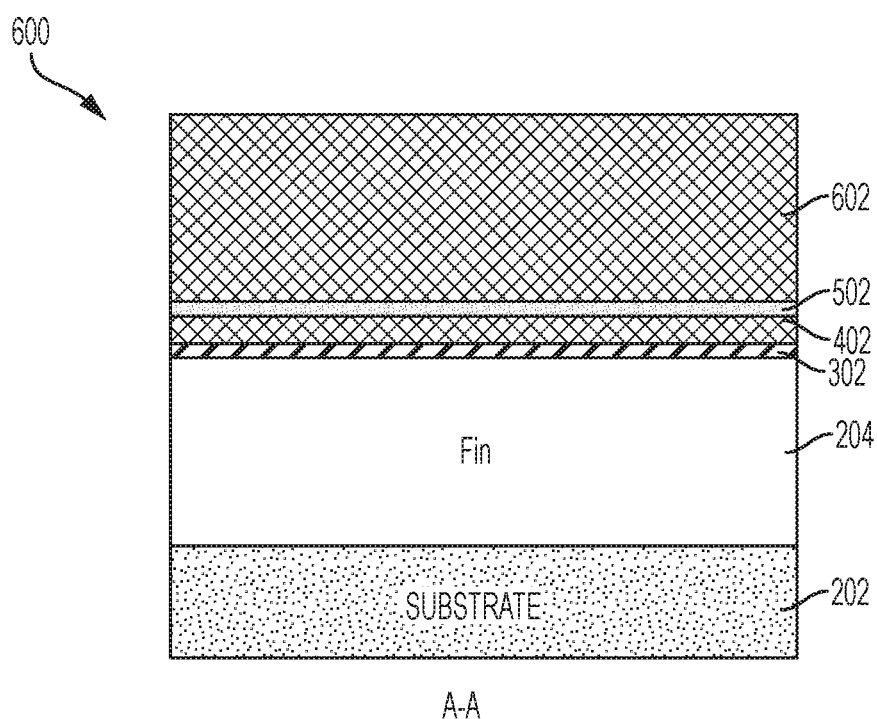
FIG. 6B shows a cross-gate view looking into a cross-section of the gate of the FinFET during the fabrication stage of FIG. 6A.
Figure 6C:
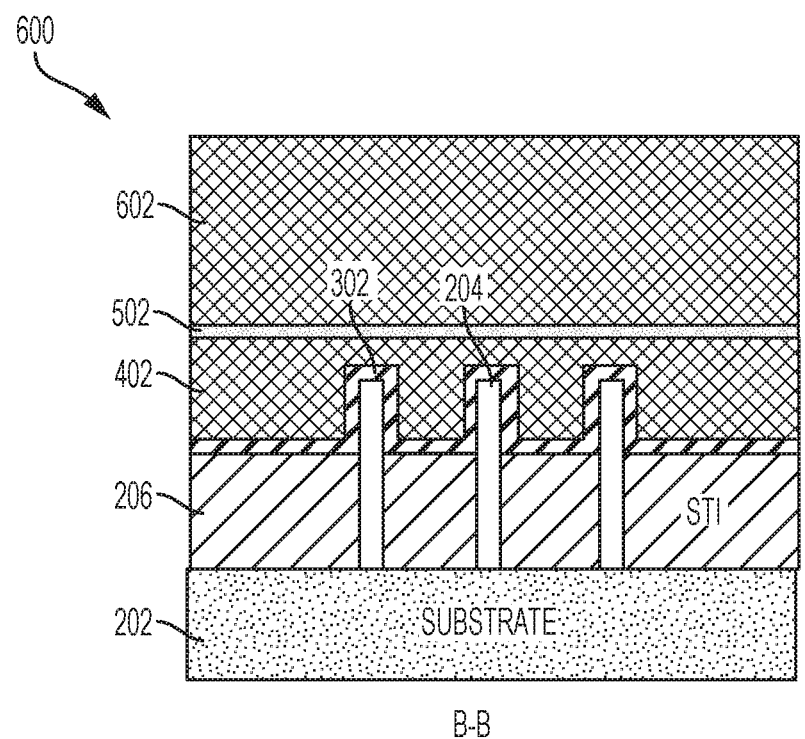
FIG. 6C shows a fin-aligned view looking into a cross-section perpendicular to the cross-section of FIG. 6B.

FIG. 6A shows a top-down view of a fabrication stage 600 in which a poly-silicon material or amorphous silicon 602 is deposited on top of the silicon nitride layer 502. FIG. 6B shows a cross-gate view looking into a cross-section of the gate of the FinFET during the fabrication stage of FIG. 6A. FIG. 6C shows a fin-aligned view looking into a cross-section perpendicular to the cross-section of FIG. 56.

Figure 7A:
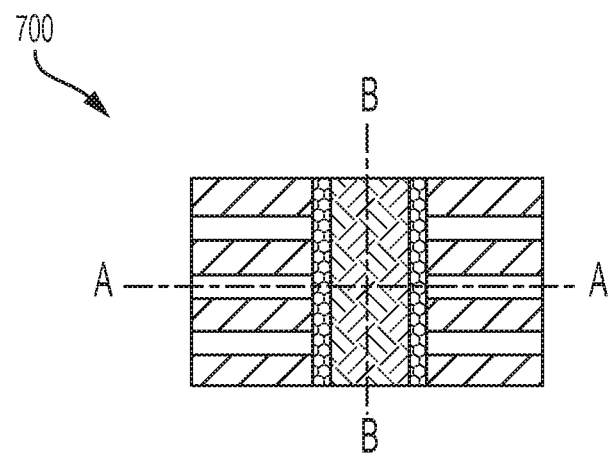
FIG. 7A shows a top-down view of a fabrication stage in which a dummy gate or sacrificial gate is made from the previously deposited layers.
Figure 7B:
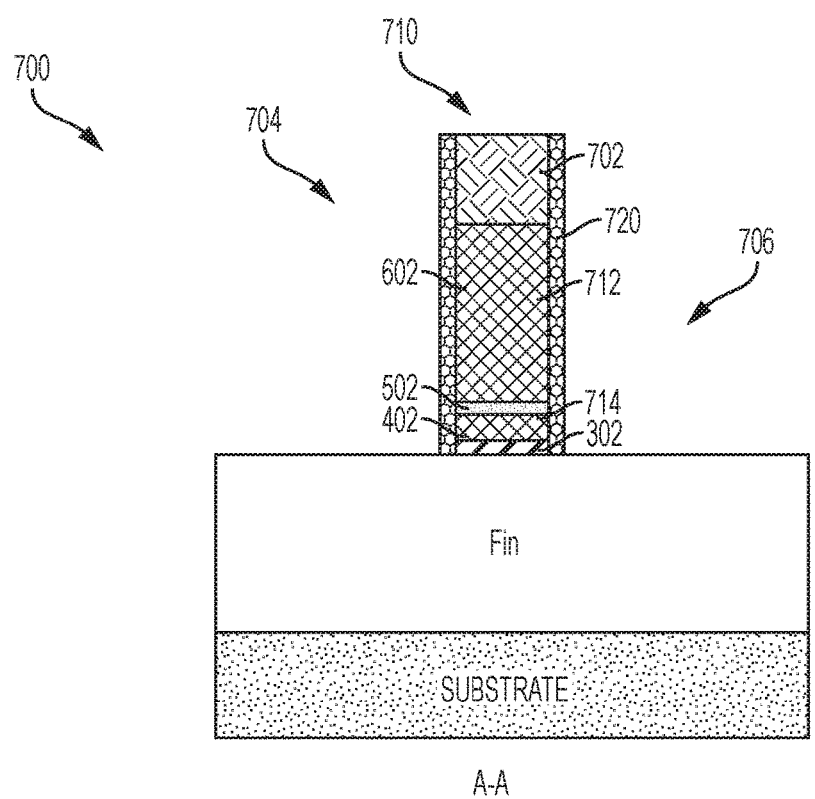
FIG. 7B shows a cross-gate view looking into a cross-section of the gate of the FinFET during the fabrication stage of FIG. 7A.
Figure 7C:
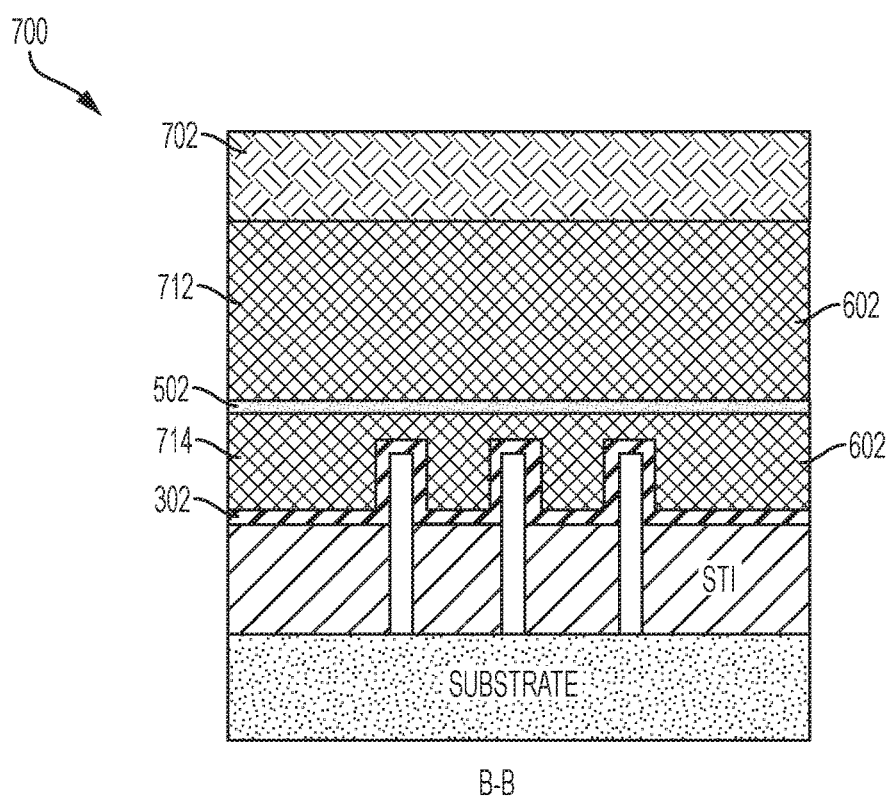
FIG. 7C shows a fin-aligned view looking into a cross-section perpendicular to the cross-section of FIG. 7B.

FIG. 7A shows a top-down view of a fabrication stage 700 in which a dummy gate or sacrificial gate 710 is made from the previously deposited layers. FIG. 7B shows a cross-gate view looking into a cross-section of the gate of the FinFET during the fabrication stage of FIG. 7A. FIG. 7C shows a fin-aligned view looking into a cross-section perpendicular to the cross-section of FIG. 7B. The sacrificial gate 710 can be made using lithography. A hard mask 702 such as silicon nitride (SiNx) is deposited directly on top of the amorphous silicon 602 and patterned to remove the hard mask 702 in the nearby areas 704 and 706. A chemical etching can then be performed to remove the layers 302, 402, 502 and 602 in the areas 704 and 706. The remaining portions of layers 302, 402, 502 and 602 form the sacrificial gate 710. Several layers of the sacrificial gate 710 are hereinafter discussed based on their function within the sacrificial gate 710. For example, the top layer of amorphous silicon 602 is an upper sacrificial layer 712 of the sacrificial gate 710 and the lower layer of amorphous silicon 302 is a lower sacrificial layer 714 of the sacrificial gate 710. Sidewall spacers 720 are deposited on both exposed sides of the sacrificial gate 710. A portion of the sidewall spacers 720 are for sacrificial purposes. In one embodiment, the material of the sidewall spacers 720 is a low-k spacer material. In various embodiments, the material of the sidewall spacers 720 is SiCO.

Figure 8A:
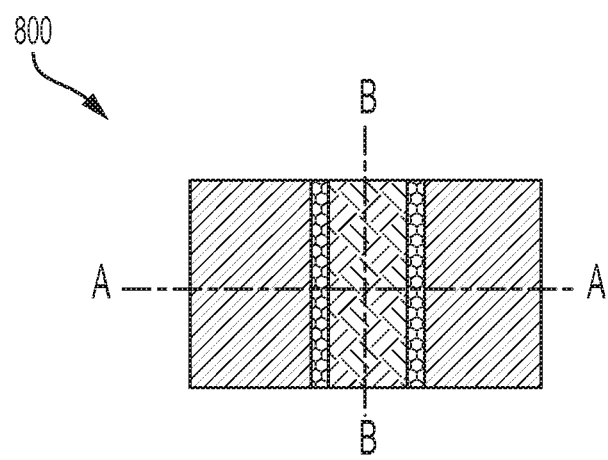
FIG. 8A shows a top-down view of a fabrication stage in which material layers are deposited on either side of the sacrificial gate.
Figure 8B:
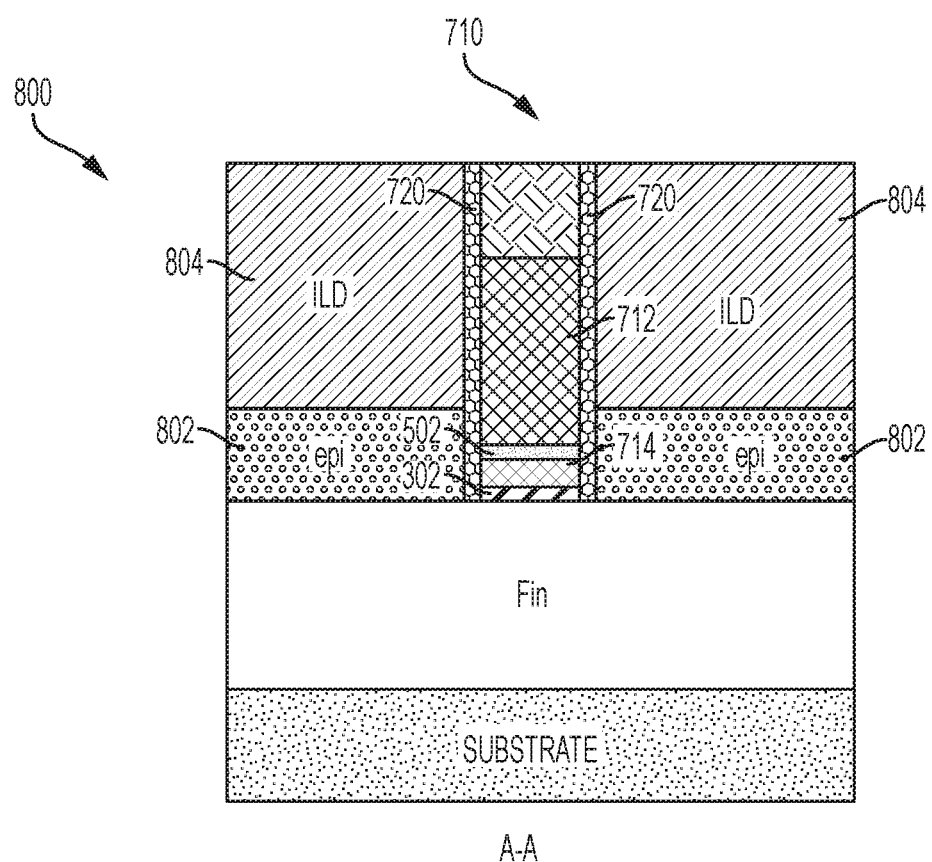
FIG. 8B shows a cross-gate view looking into a cross-section of the gate of the FinFET during the fabrication stage of FIG. 8A.
Figure 8C:
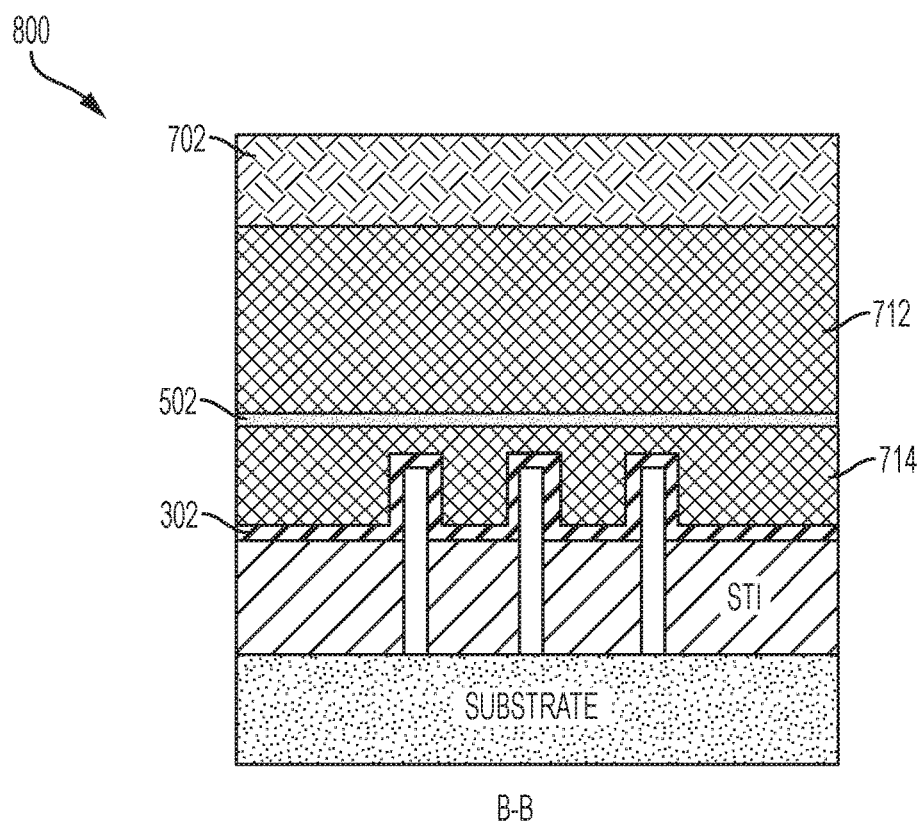
FIG. 8C shows a fin-aligned view looking into a cross-section perpendicular to the cross-section of FIG. 8B.

FIG. 8A shows a top-down view of a fabrication stage 800 in which material layers are deposited on either side of the sacrificial gate 710. FIG. 8B shows a cross-gate view looking into a cross-section of the gate of the FinFET during the fabrication stage of FIG. 8A. FIG. 8C shows a fin-aligned view looking into a cross-section perpendicular to the cross-section of FIG. 8B. An epitaxial layer 802 is formed over the FinFET material outside of the gate structure. The epitaxial layer 802 can include SiGe, doped SiGe, etc. An interlayer dielectric material layer 804 is formed on top of the epitaxial layer 802.

Figure 9A:
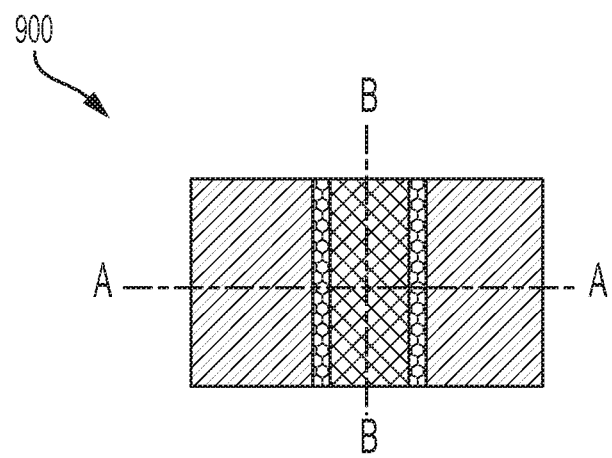
FIG. 9A shows a top-down view of a fabrication stage in which the hard mask of the sacrificial gate is removed.
Figure 9B:
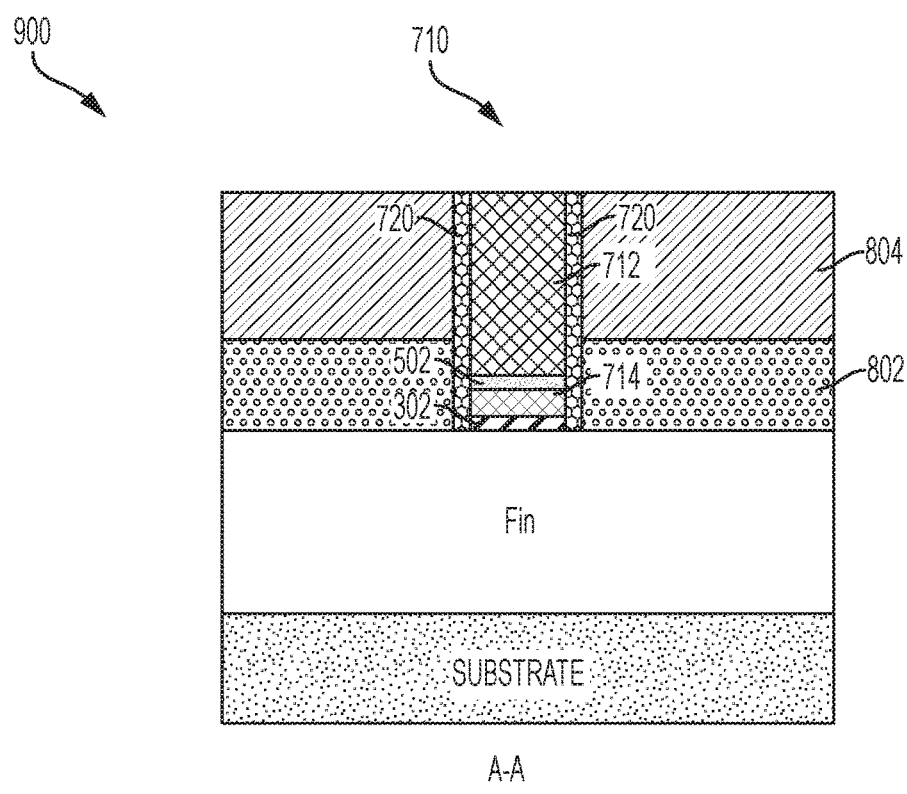
FIG. 9B shows a cross-gate view looking into a cross-section of the gate of the FinFET during the fabrication stage of FIG. 9A.
Figure 9C:
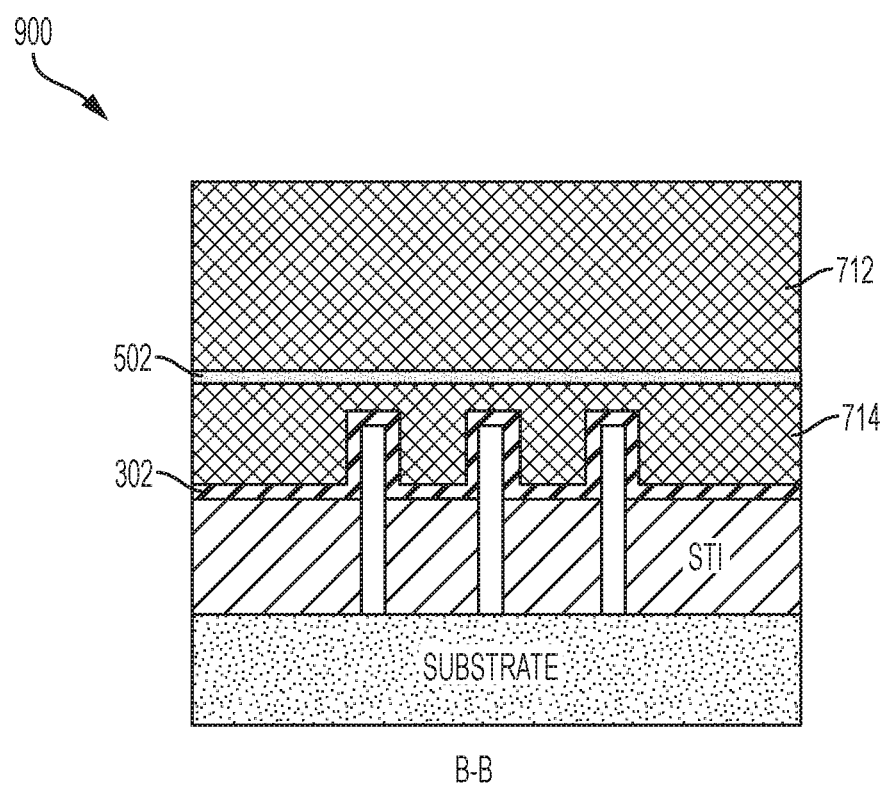
FIG. 9C shows a fin-aligned view looking into a cross-section perpendicular to the cross-section of FIG. 9B.

FIG. 9A shows a top-down view of a fabrication stage 900 in which the hard mask 702 of the sacrificial gate 710 is removed. FIG. 9B shows a cross-gate view looking into a cross-section of the gate of the FinFET during the fabrication stage of FIG. 9A. FIG. 9C shows a fin-aligned view looking into a cross-section perpendicular to the cross-section of FIG. 9B. The fabrication stage 900 can include chemical mechanical polishing to remove the hard mask 702 from the sacrificial gate structure 710, thereby exposing the upper sacrificial layer 712. The interlayer dielectric material 804 outside of the sacrificial gate 710 is simultaneously polished to a height at which the upper sacrificial layer 712 is exposed.

Figure 10A:
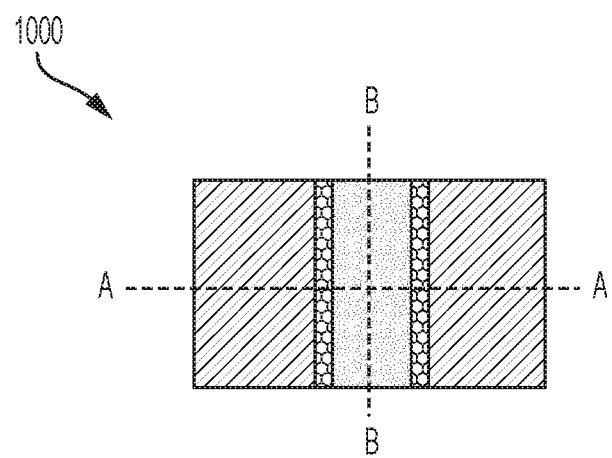
FIG. 10A shows a top-down view of a fabrication stage in which the upper sacrificial layer is removed from the sacrificial gate.
Figure 10B:
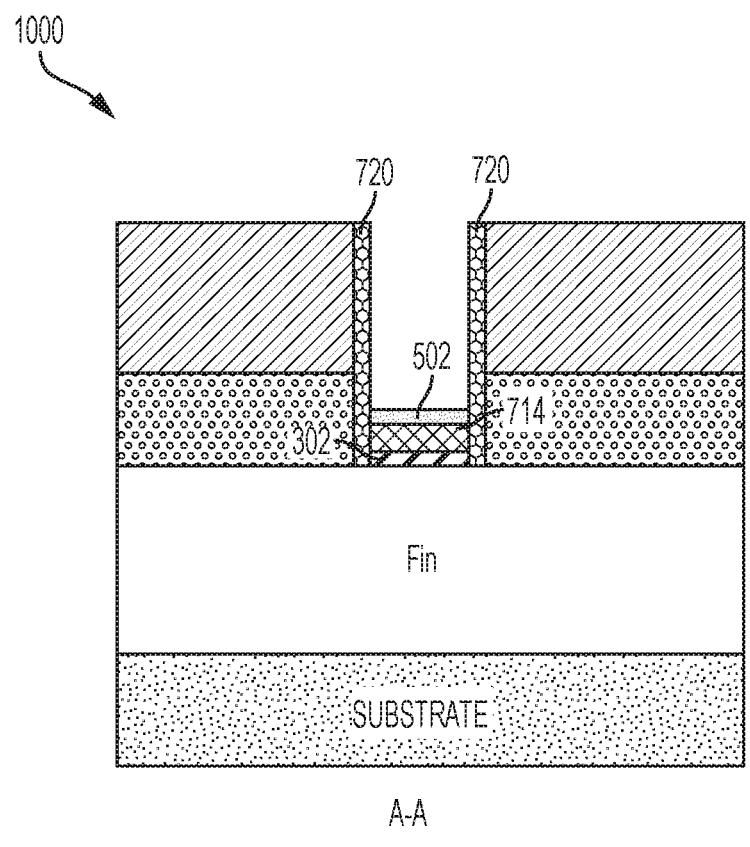
FIG. 10B shows a cross-gate view looking into a cross-section of the gate of the FinFET during the fabrication stage of FIG. 10A.
Figure 10C:
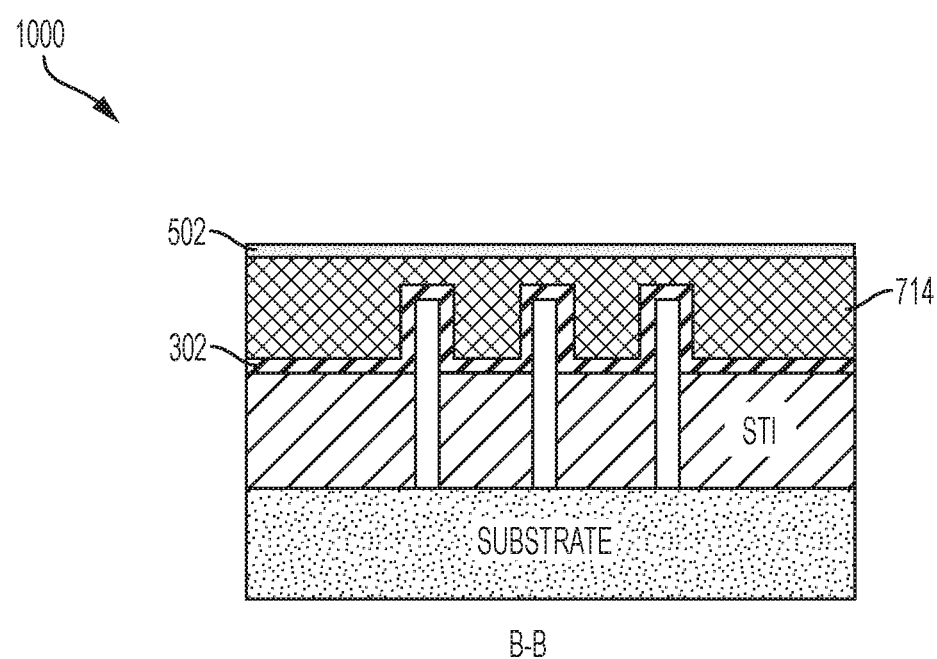
FIG. 10C shows a fin-aligned view looking into a cross-section perpendicular to the cross-section of FIG. 10B.

FIG. 10A shows a top-down view of a fabrication stage 1000 in which the upper sacrificial layer 712 is removed from the sacrificial gate 710. FIG. 10B shows a cross-gate view looking into a cross-section of the gate of the FinFET during the fabrication stage of FIG. 10A. FIG. 10C shows a fin-aligned view looking into a cross-section perpendicular to the cross-section of FIG. 10B. The upper sacrificial layer can be removed using an etching process. The silicon nitride layer 502 between the upper sacrificial layer 712 and the lower sacrificial layer 714 prevents etching of the lower sacrificial layer 714. Removing the upper sacrificial layer 712 exposes a gate-facing side of the sidewall spacer 720. The portion of the sidewall spacer 720 that extends above the silicon nitride layer 502 is left exposed. Meanwhile, a portion of the sidewall spacer 720 below the silicon nitride layer 502 remains unexposed.

Figure 11A:
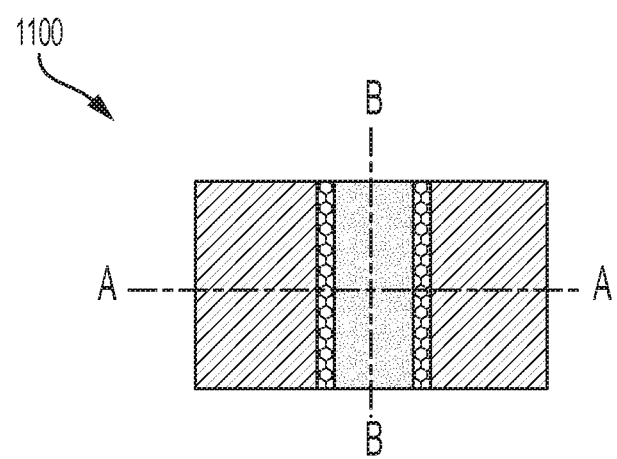
FIG. 11A shows a top-down view of a fabrication stage in which the exposed portion of the sidewall spacer is removed.
Figure 11B:
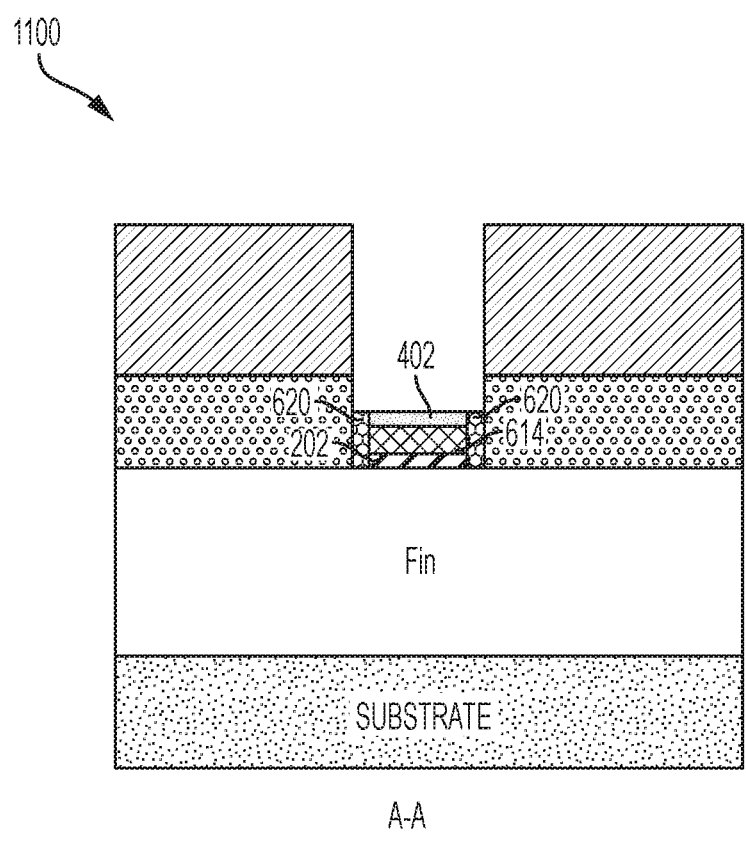
FIG. 11B shows a cross-gate view looking into a cross-section of the gate of the FinFET during the fabrication stage of FIG. 11A.
Figure 11C:
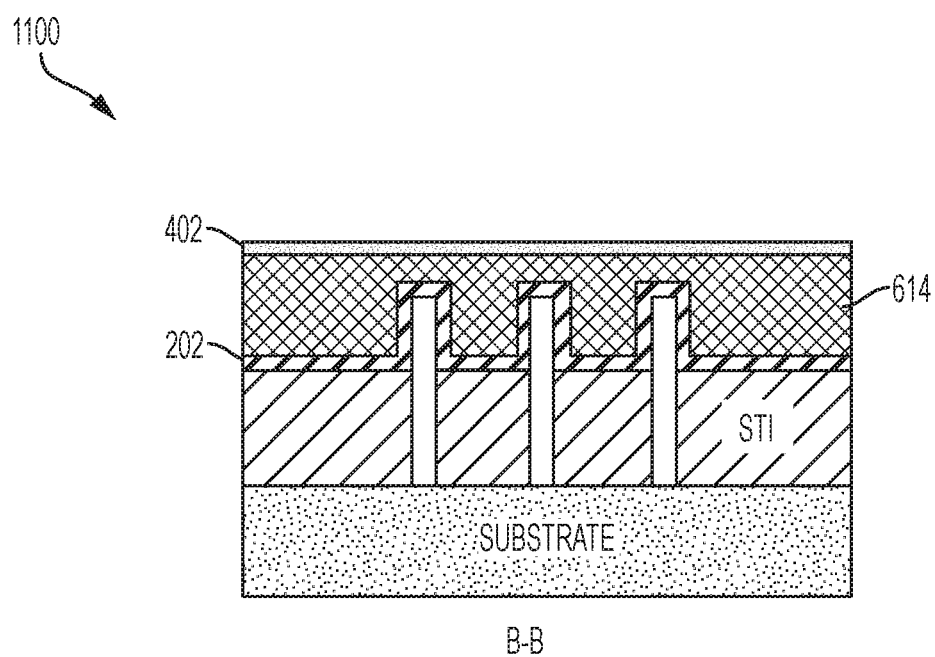
FIG. 11C shows a fin-aligned view looking into a cross-section perpendicular to the cross-section of FIG. 11B.

FIG. 11A shows a top-down view of a fabrication stage 1100 in which the exposed portion of the sidewall spacer (i.e., the portion of the sidewall spacer above the silicon nitride layer 502) is removed. FIG. 11B shows a cross-gate view looking into a cross-section of the gate of the FinFET during the fabrication stage of FIG. 11A. FIG. 11C shows a fin-aligned view looking into a cross-section perpendicular to the cross-section of FIG. 11B. The portion of the sidewall spacer 720 below the silicon nitride layer 502 is left in place to form a lower portion of a sidewall spacer that is created in subsequent fabrication stages. In various embodiments, portions of the interlayer dielectric material 804 and/or the epitaxial layer 802 that are next to the gate or sidewall region can be removed or trimmed, thereby allowing for extending a width of sidewall spacer that is formed at subsequent fabrications stages.

Figure 12A:
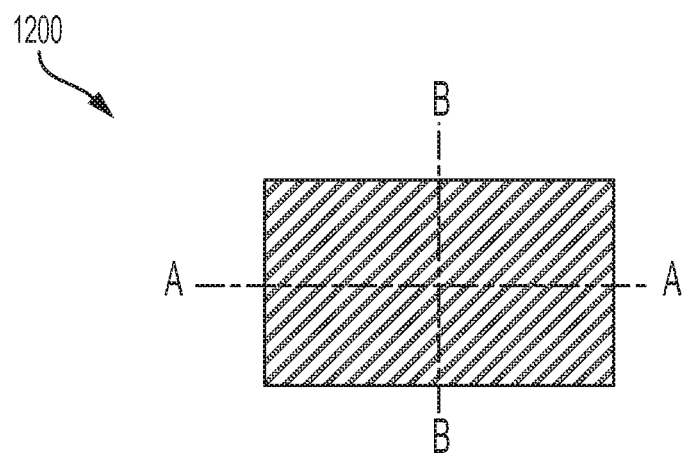
FIG. 12A shows a top-down view of a fabrication stage in which a temporary spacer material is formed in place of the portion of the sidewall spacer removed during the tenth manufacturing step.
Figure 12B:
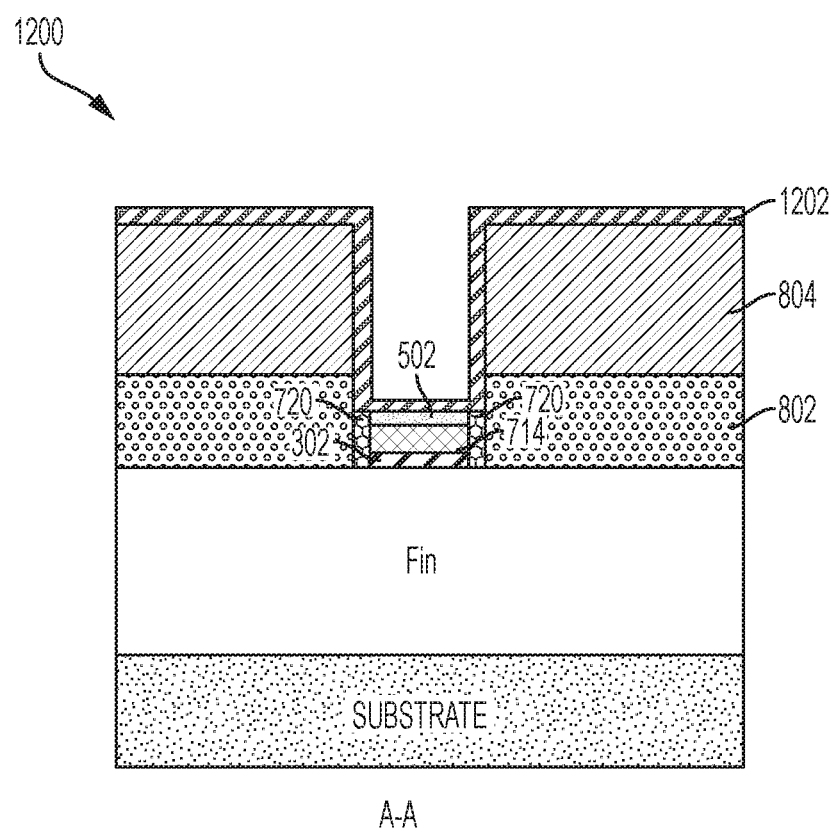
FIG. 12B shows a cross-gate view looking into a cross-section of the gate of the FinFET during the fabrication stage of FIG. 12A.
Figure 12C:
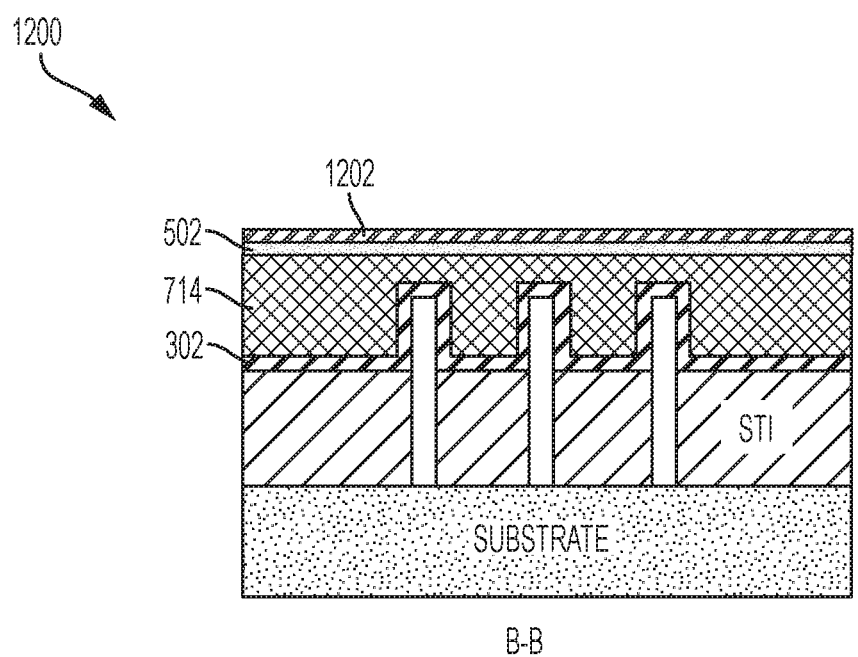
FIG. 12C shows a fin-aligned view looking into a cross-section perpendicular to the cross-section of FIG. 12B.

FIG. 12A shows a top-down view of a fabrication stage 1200 in which a temporary spacer material 1202 is formed in place of the portion of the sidewall spacer removed during the tenth fabrication stage 1100. FIG. 12B shows a cross-gate view looking into a cross-section of the gate of the FinFET during the fabrication stage of FIG. 12A. FIG. 12C shows a fin-aligned view looking into a cross-section perpendicular to the cross-section of FIG. 12B. In this fabrication stage the temporary spacer material 1202 is deposited by conformal deposition methods and. The temporary spacer material 1202 includes silicon nitride (SiN) and forms a layer that covers the ILD layer 804 outside of the gates structure, the silicon nitride layer 502 within the gates structure, and also extends vertically in a sidewall spacer region to take the place of the removed portion of the sidewall spacer 520.

Figure 12D:
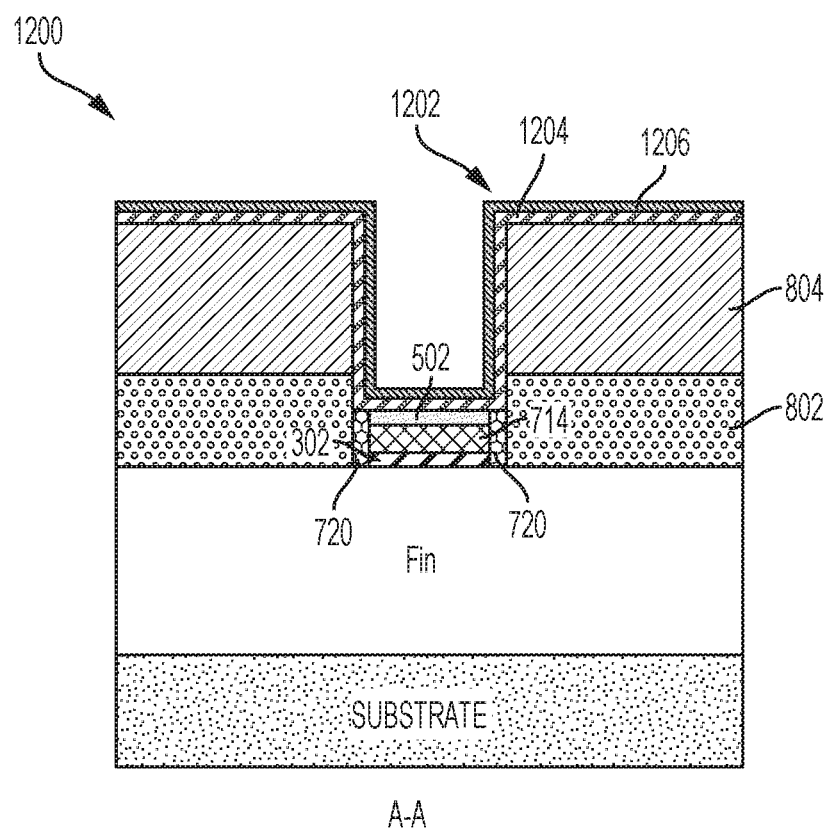
FIG. 12D shows an embodiment having a dual layer structure with an upper SiN layer and a lower SiCO layer.
Figure 12E:
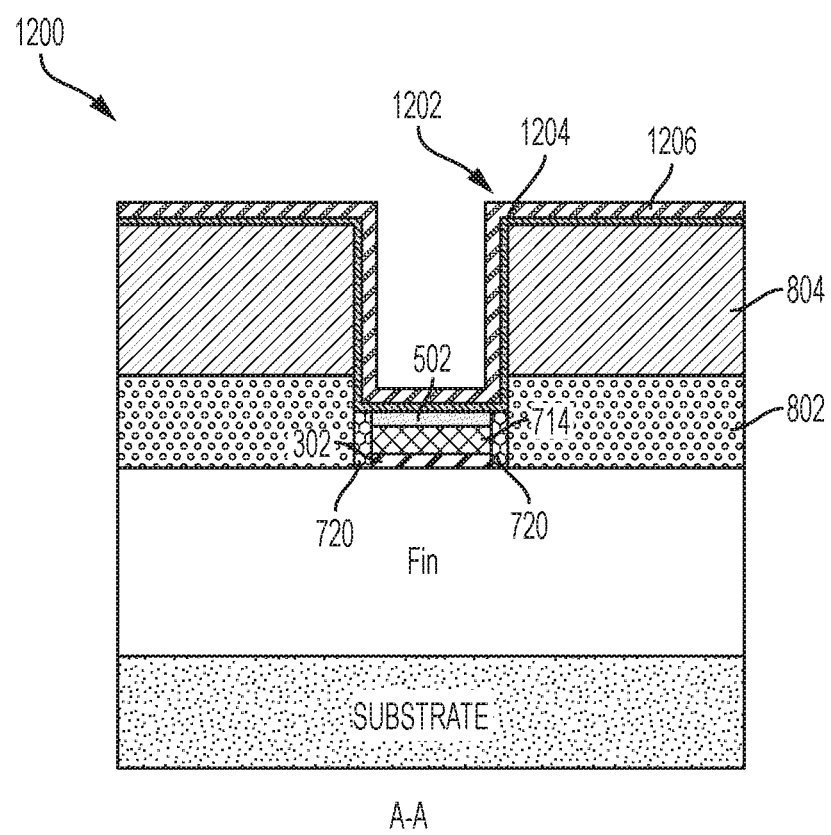
FIG. 12E shows an embodiment having a dual layer structure having a lower SiN layer and an upper SiCO layer.
Figure 12F:
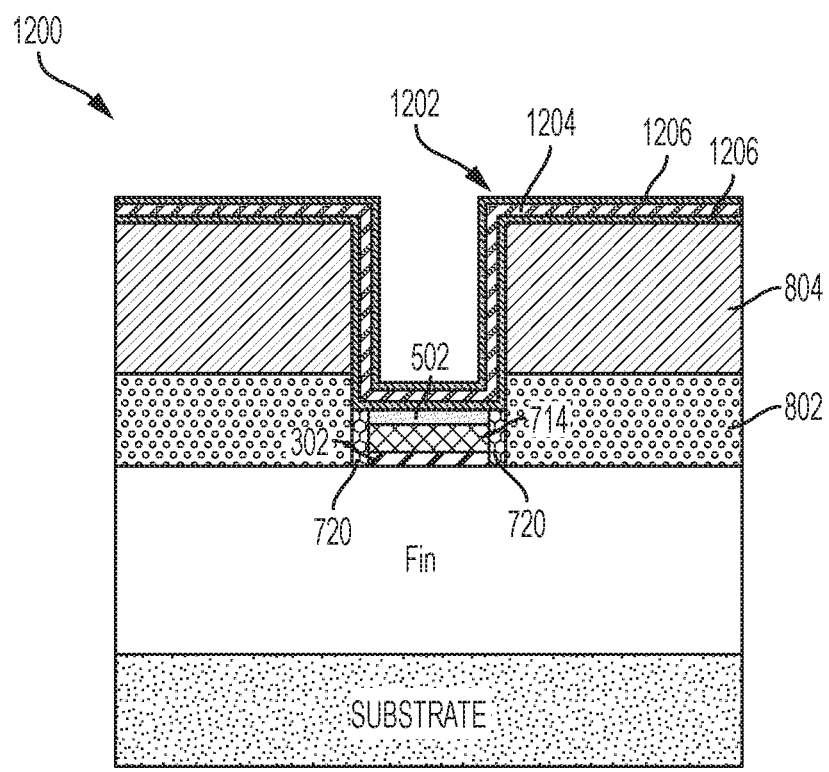
FIG. 12F shows an embodiment in which the temporary spacer material includes a tri-layer structure with a central SiN layer 1204 between upper and lower SiCO layers.

FIGS. 12D-F shows a cross-gate view similar to FIG. 12B for embodiments in which the temporary spacer material 1202 is multi-layered, that includes at least one layer that can be etched or removed in order to provide an airgap and at least one layer that remains after etching in order to form a wall of the sidewall spacer. In various embodiments, the temporary spacer material 1202 has a dual layer structure. The dual layer structure can have a sacrificial layer such as a SiN layer 1204 and low-k material layer such as a SiCO layer 1206 or other material layer that is resistant to etching and is retained in the final product. FIG. 12D shows an embodiment in which the dual layer structure has the SiN layer 1204 as the upper layer and the SiCO layer 1206 as the lower layer. Along the vertical sidewall sections, the SiN layer 1204 forms an inner wall adjacent the gate area and the SiCO layer 1206 forms a sidewall adjacent the interlayer dielectric material 804 and the epitaxial layer 802. FIG. 12E shows an embodiment in which the SiN layer 1204 forms a lower layer of the dual layer structure while the SiCO layer 1206 forms an upper layer of the dual layer structure. Along the vertical sidewall sections, the SiN layer 1204 forms an outer sidewall adjacent the interlayer dielectric material 804 and the epitaxial layer 802 and the SiCO layer 1206 forms an inner sidewall is adjacent the gate area. FIG. 12F shows an embodiment in which the temporary spacer material 1202 includes a tri-layer structure, with an SiN layer 1204 forming a central layer sandwiched between two SiCO layers 1206.

Figure 13A:
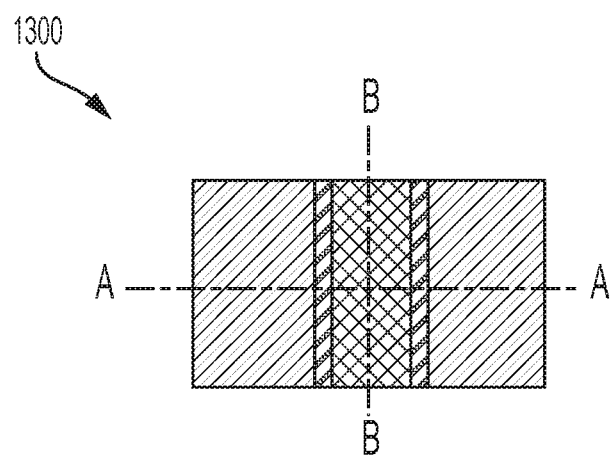
FIG. 13A shows a top-down view of a fabrication stage in which the horizontal layers of the temporary spacer material are removed.
Figure 13B:
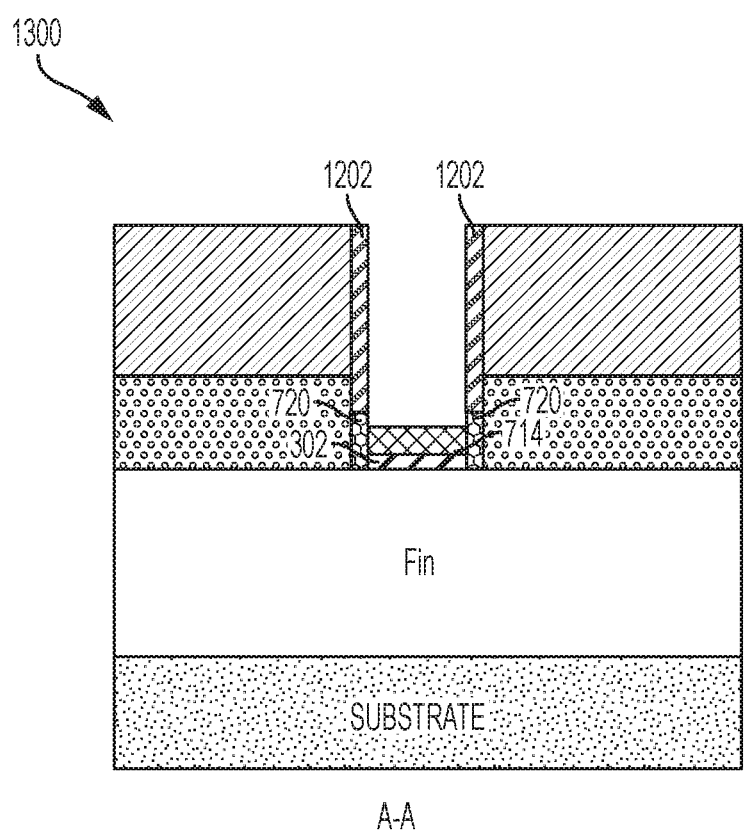
FIG. 13B shows a cross-gate view looking into a cross-section of the gate of the FinFET during the fabrication stage of FIG. 13A.
Figure 13C:
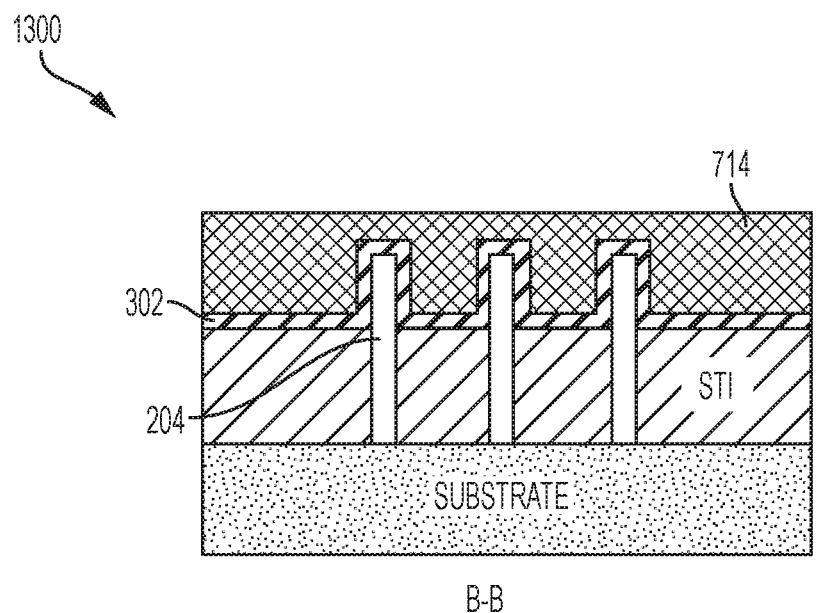
FIG. 13C shows a fin-aligned view looking into a cross-section perpendicular to the cross-section of FIG. 13B.

FIG. 13A shows a top-down view of a fabrication stage 1300 in which the horizontal layers of the temporary spacer material 1202 are removed. FIG. 13B shows a cross-gate view looking into a cross-section of the gate of the FinFET during the fabrication stage of FIG. 13A. FIG. 13C shows a fin-aligned view looking into a cross-section perpendicular to the cross-section of FIG. 13B. A directional reactive-ion etching (ME) is performed to remove the horizontal surfaces of the temporary spacer material, thereby leaving the vertically-aligned temporary spacer material 1202 in the sidewall spacer region. Directional (ME) is also performed to remove the silicon nitride layer 402, thereby exposing the lower sacrificial layer 614.

Figure 14A:
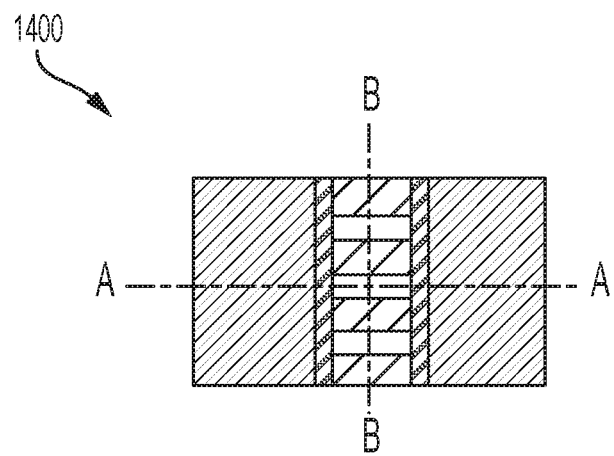
FIG. 14A shows a top-down view of a fabrication stage in which the lower sacrificial layer and the oxide liner are removed from within the gate area.
Figure 14B:
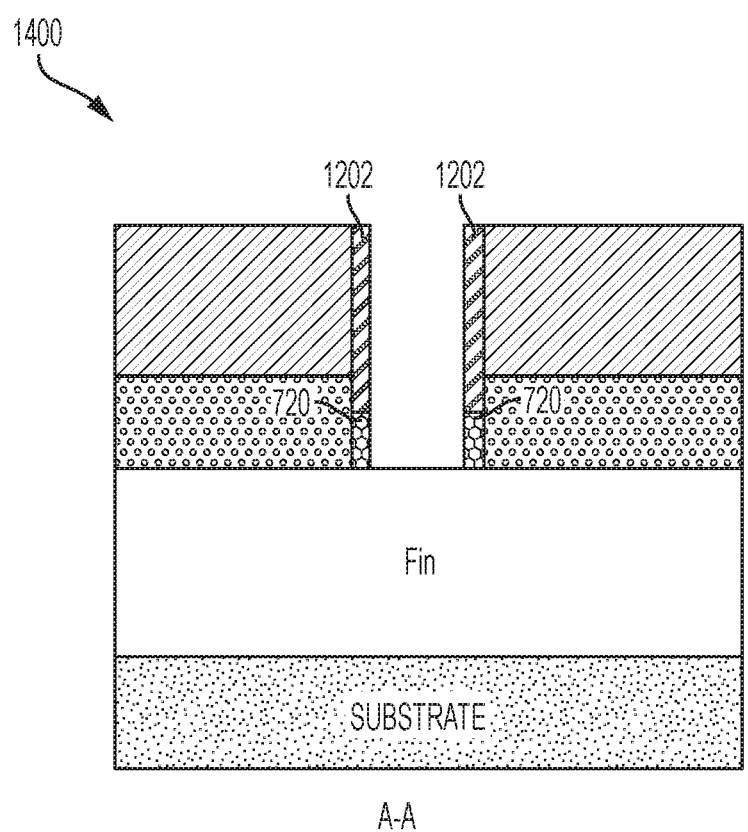
FIG. 14B shows a cross-gate view looking into a cross-section of the gate of the FinFET during the fabrication stage of FIG. 14A.
Figure 14C:
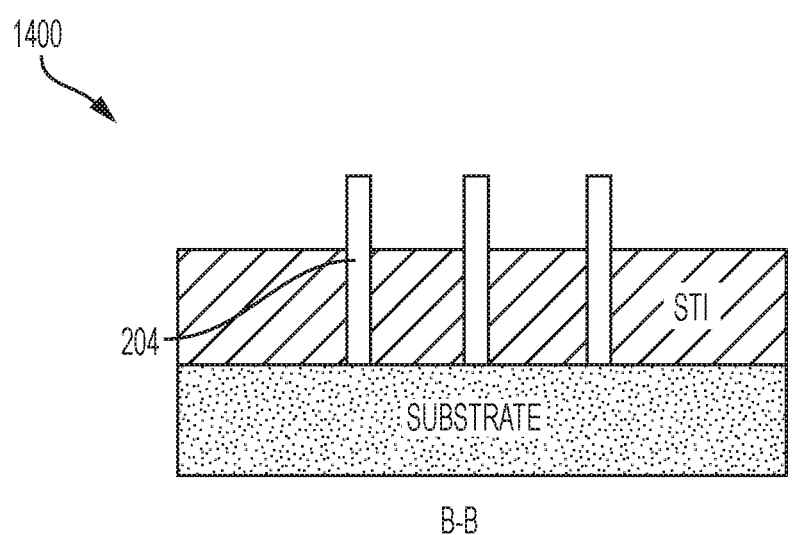
FIG. 14C shows a fin-aligned view looking into a cross-section perpendicular to the cross-section of FIG. 14B.

FIG. 14A shows a top-down view of a fabrication stage 1400 in which the lower sacrificial layer 714 and the oxide liner 302 are removed from within the gate area 710 Removal of these layers exposes the top surfaces of the fins 204 in the gate area. FIG. 14B shows a cross-gate view looking into a cross-section of the gate of the FinFET during the fabrication stage of FIG. 14A. FIG. 14C shows a fin-aligned view looking into a cross-section perpendicular to the cross-section of FIG. 14B.

Figure 15A:
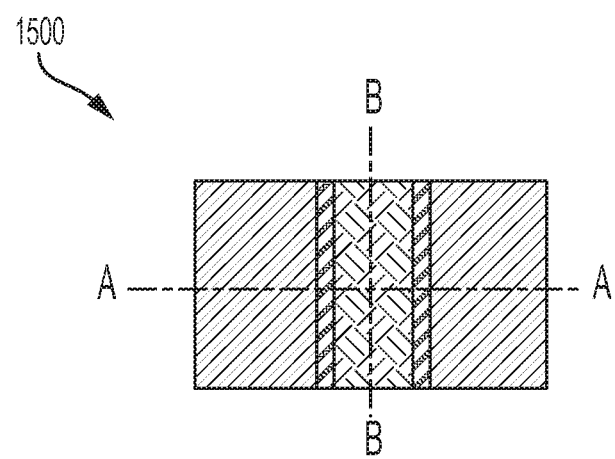
FIG. 15A shows a top-down view of a fabrication stage in which a replacement metal gate is formed.
Figure 15B:
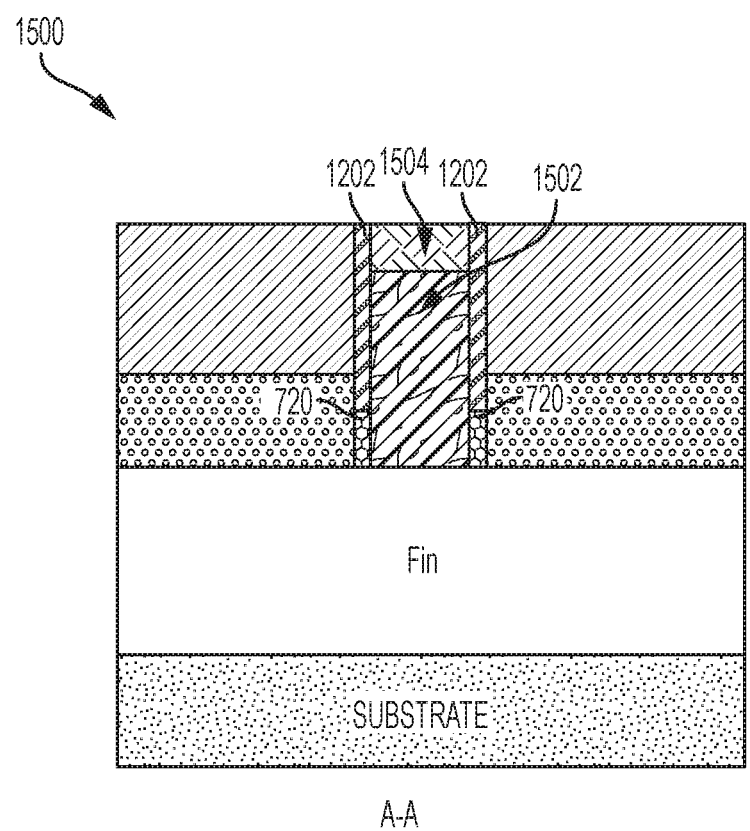
FIG. 15B shows a cross-gate view looking into a cross-section of the gate of the FinFET during the fabrication stage of FIG. 15A.
Figure 15C:
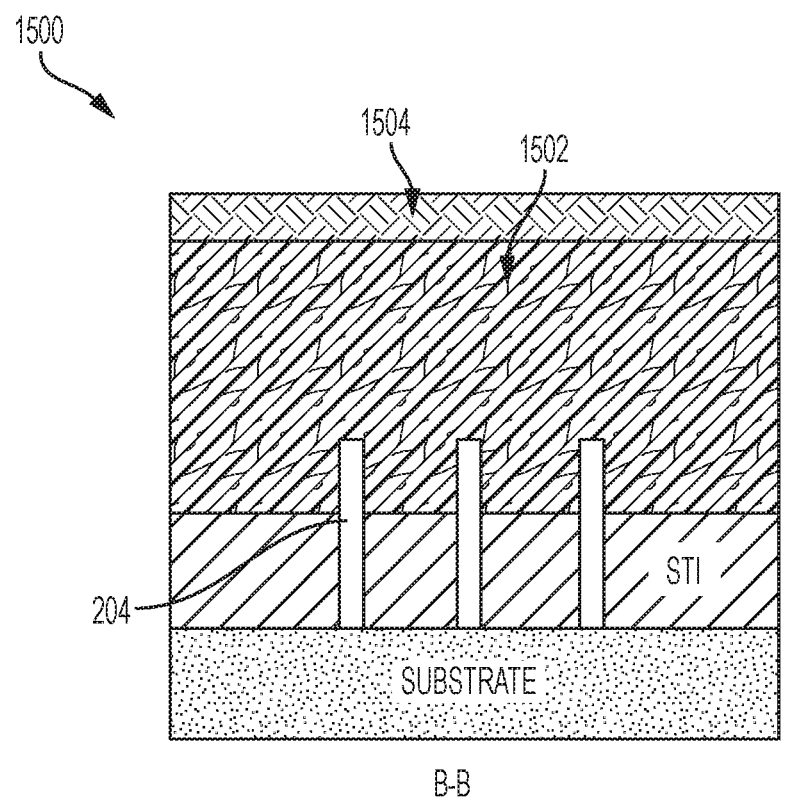
FIG. 15C shows a fin-aligned view looking into a cross-section perpendicular to the cross-section of FIG. 15B.

FIG. 15A shows a top-down view of a fabrication stage 1500 in which a replacement metal gate 1502 is formed. FIG. 15B shows a cross-gate view looking into a cross-section of the gate of the FinFET during the fabrication stage of FIG. 15A. FIG. 15C shows a fin-aligned view looking into a cross-section perpendicular to the cross-section of FIG. 15B. A gate material is deposited into the gate area to cover the top surfaces of the fins 204 in the gate area. The gate material generally includes a high-k material and/or suitable metals. The material of the metal gate 1502 can be deposited in the gate area and a silicon nitride cap 1504 is deposited on the top of the metal gate 1502. Chemical mechanical polishing can be used to polish the silicon nitride cap 1504 down to a selected height.

Figure 16A:
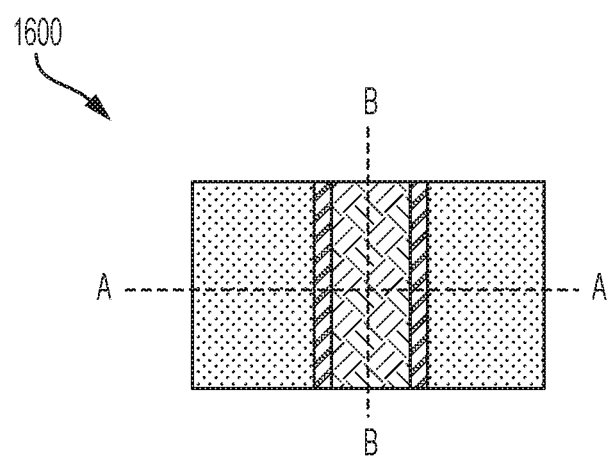
FIG. 16A shows a top-down view of a fabrication stage in which trench contacts are formed, such as the source and drain contacts.
Figure 16B:
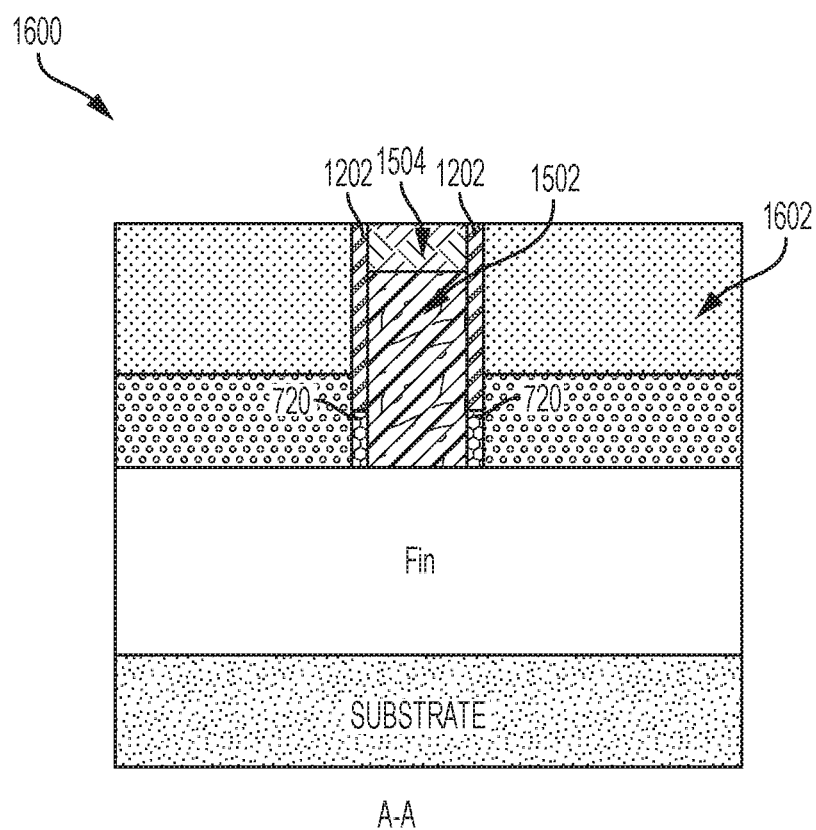
FIG. 16B shows a cross-gate view looking into a cross-section of the gate of the FinFET during the fabrication stage of FIG. 16A.
Figure 16C:
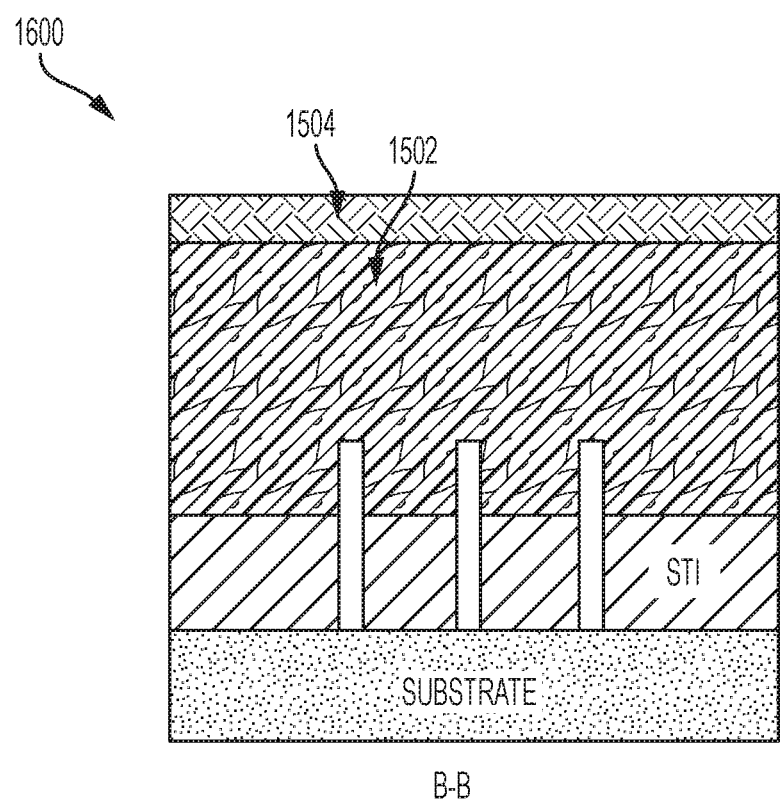
FIG. 16C shows a fin-aligned view looking into a cross-section perpendicular to the cross-section of FIG. 16B.

FIG. 16A shows a top-down view of a fabrication stage 1600 in which trench contacts 1602 are formed, such as the source and drain contacts. The ILD layer 804 material is removed, generally by etching, and replaced by a suitable metal, such as tungsten for example, for the trench contracts 1602. FIG. 16B shows a cross-gate view looking into a cross-section of the gate of the FinFET during the fabrication stage of FIG. 16A. FIG. 16C shows a fin-aligned view looking into a cross-section perpendicular to the cross-section of FIG. 16B.

Figure 17A:
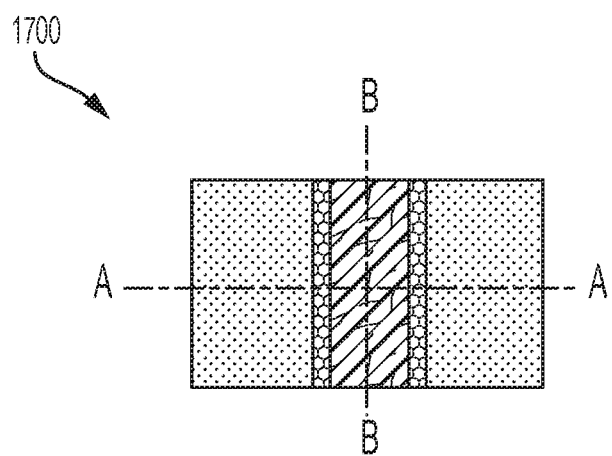
FIG. 17A shows a top-down view of a fabrication stage in which the remaining temporary spacer material is removed.
Figure 17B:
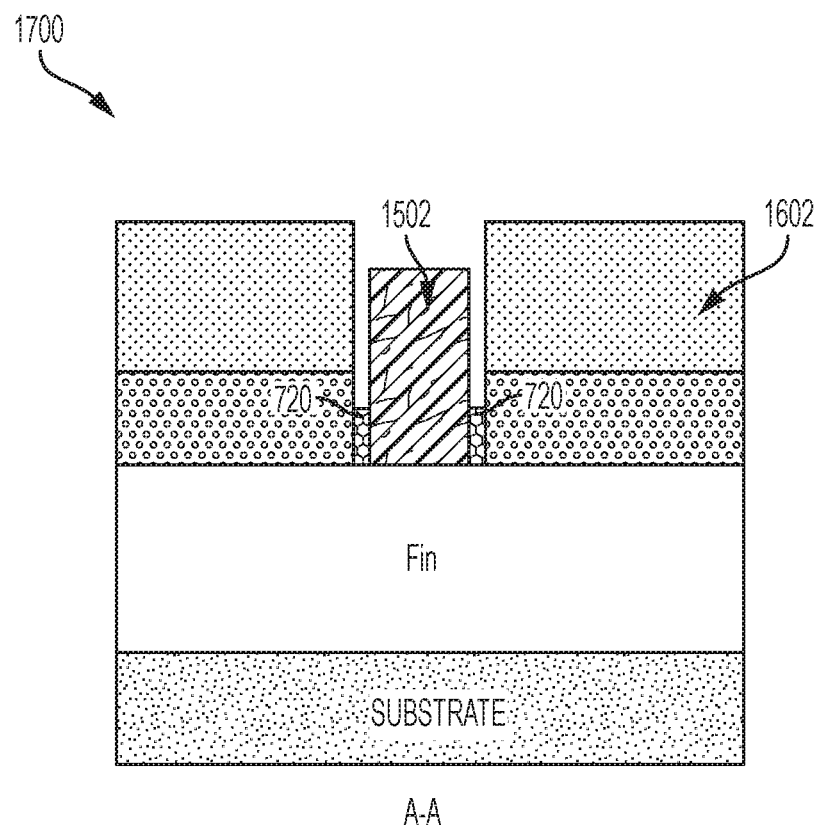
FIG. 17B shows a cross-gate view looking into a cross-section of the gate of the FinFET during the fabrication stage of FIG. 17A.
Figure 17C:
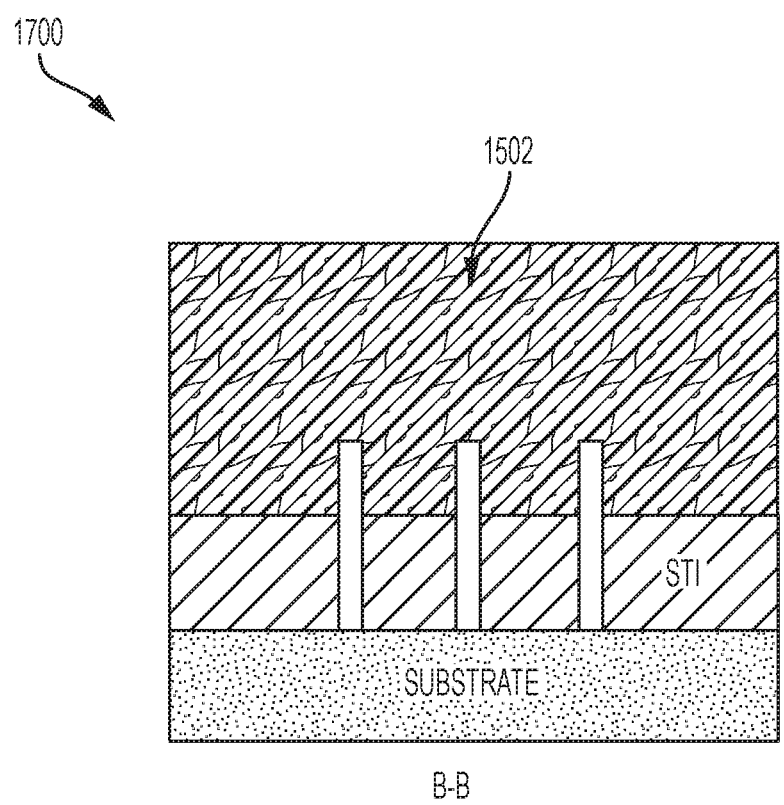
FIG. 17C shows a fin-aligned view looking into a cross-section perpendicular to the cross-section of FIG. 17B.

FIG. 17A shows a top-down view of a fabrication stage 1700 in which the remaining temporary spacer material 1202 is removed. FIG. 17B shows a cross-gate view looking into a cross-section of the gate of the FinFET during the fabrication stage of FIG. 17A. FIG. 17C shows a fin-aligned view looking into a cross-section perpendicular to the cross-section of FIG. 17B. Etching can be used to remove the silicon nitride cap 1504 and the vertically-oriented temporary spacer material 1202. While the etching removes the temporary spacer material to vacate an upper sidewall region, the lower portion of the sidewall spacer 702, which is made of SiCO, can act as an etch stop and therefore remains intact after the etching.

Figure 17D:
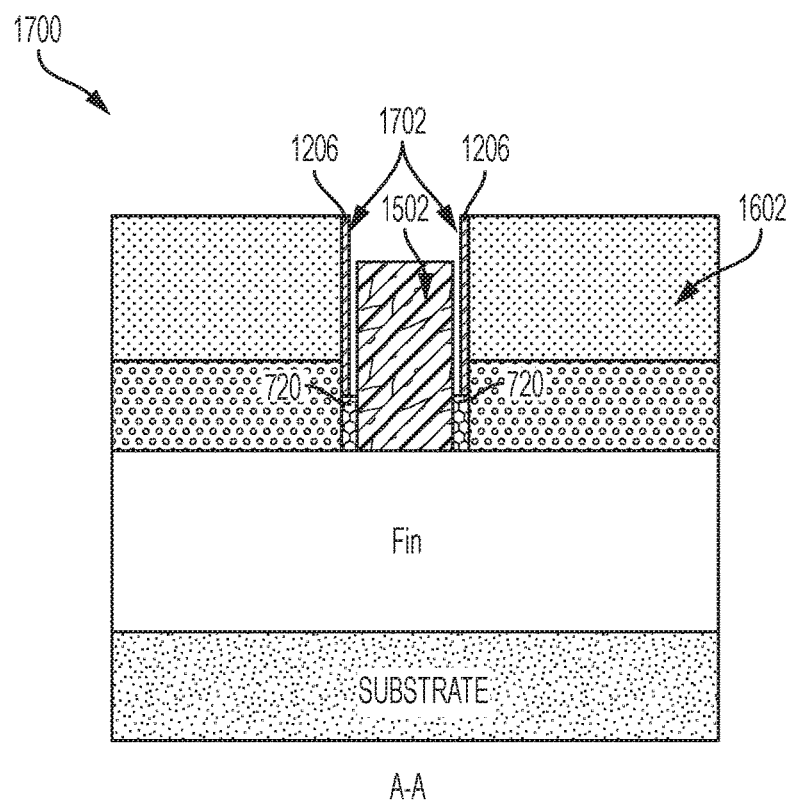
FIG. 17D shows a sidewall spacer having a SiOC wall adjacent to a metal gate and an airgap adjacent to an interlayer dielectric material.
Figure 17E:
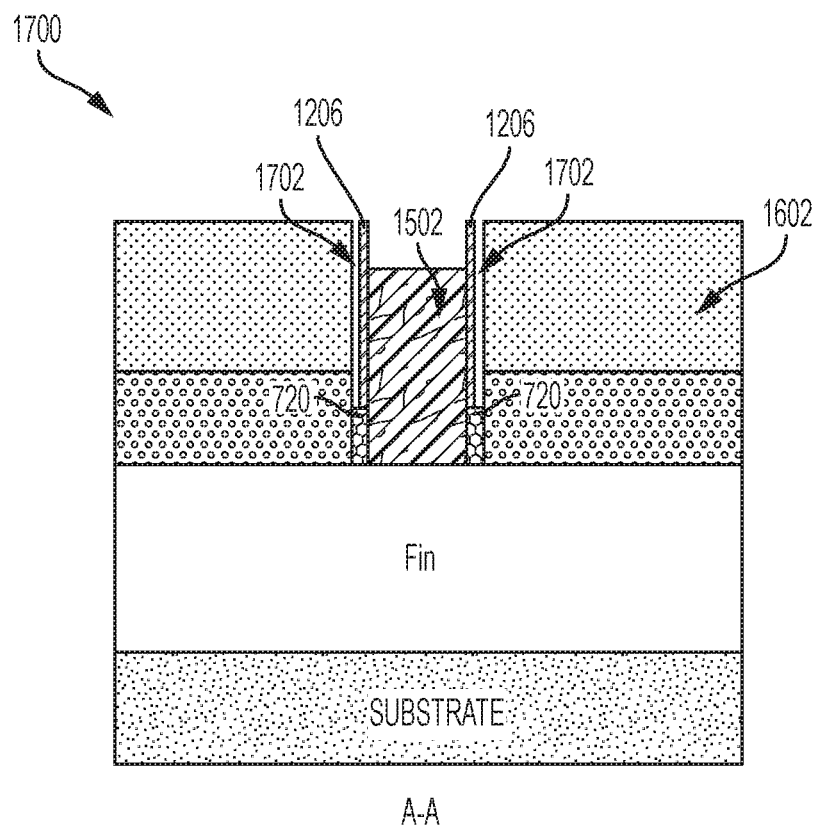
FIG. 17E shows a sidewall spacer having a SiOC wall adjacent to the interlayer dielectric material and an airgap adjacent to the metal gate.
Figure 17F:
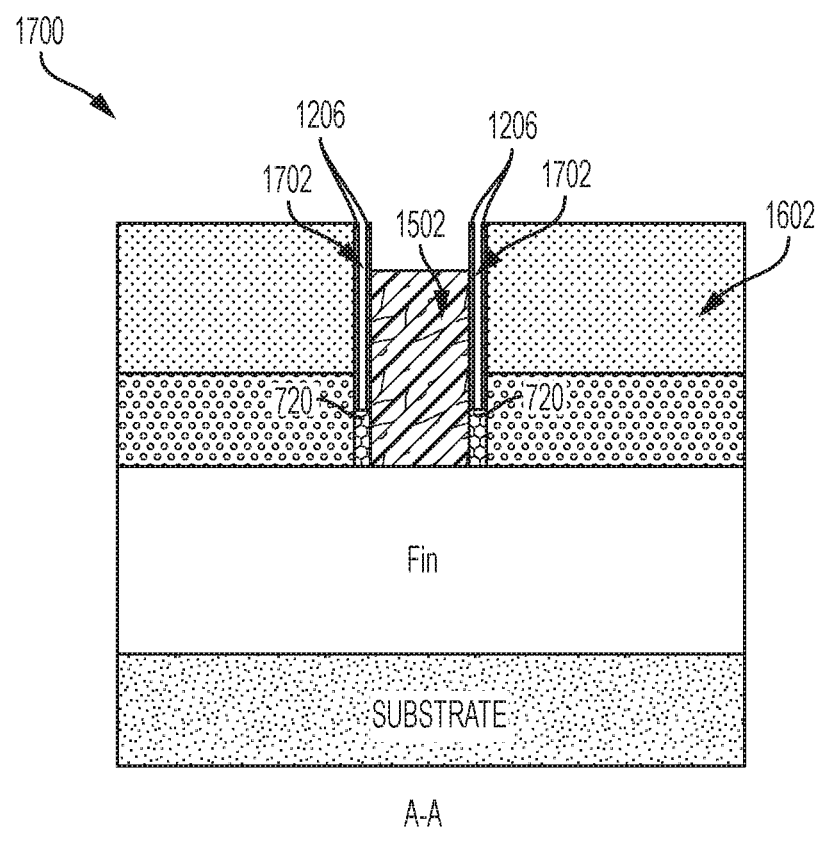
FIG. 17F shows a sidewall spacer having an SiOC sidewall next to the interlayer dielectric material, an SiOC sidewall next to the metal gate, and an airgap in between the SiOC sidewalls.

FIGS. 17D-F show cross-gate views similar to FIG. 17B displaying a sidewall airgap resulting from etching the dual layer structures shown in FIGS. 12D and 12E as well as the tri-layer structure shown in FIG. 12F. In FIG. 17D, the SiN layer has been removed, leaving the SiOC layer 1206 adjacent to the metal gate 1502 and an airgap 1702 adjacent to the interlayer dielectric material 804 and the epitaxial layer 802. In FIG. 17E, the SiN layer has been removed, leaving the SiOC layer 1206 adjacent to the interlayer dielectric material 804 and the epitaxial layer 802 and an airgap 1702 adjacent to the metal gate 1502. In FIG. 17F, the central SiN layer has been removed, leaving an SiOC sidewall 1206 next to the interlayer dielectric material 804 and the epitaxial layer 802 and an SiOC sidewall 1206 next to the metal gate 1502 with an airgap 1702 in between the SiOC sidewalls 1206.

Figure 18A:
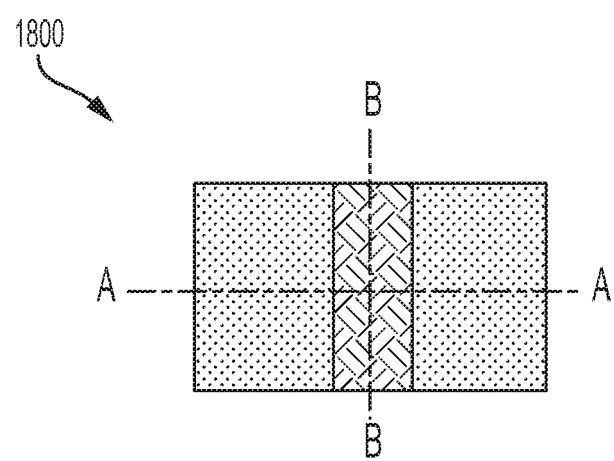
FIG. 18A shows a top-down view of a fabrication stage in which an airgap spacer material is deposited in the upper sidewall region vacated during the sixteenth manufacturing stage.
Figure 18B:
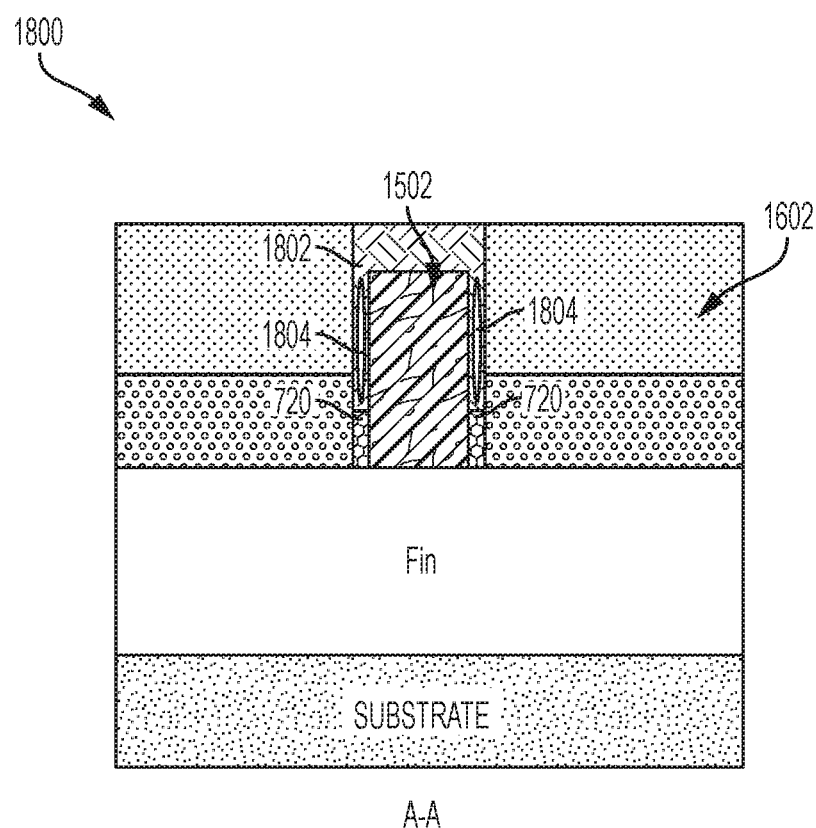
FIG. 18B shows a cross-gate view looking into a cross-section of the gate of the FinFET during the fabrication stage of FIG. 18A.
Figure 18C:
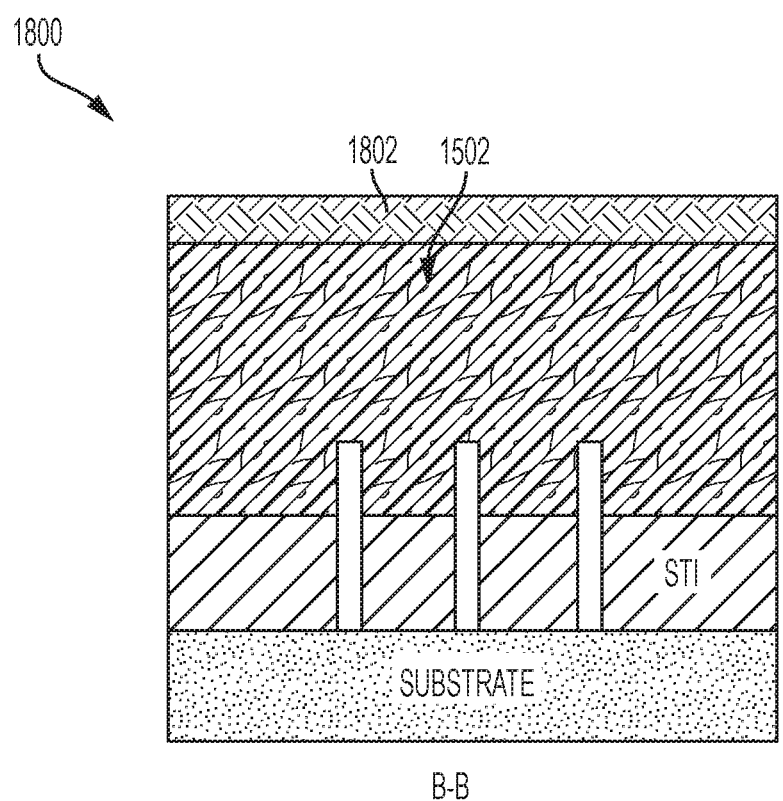
FIG. 18C shows a fin-aligned view looking into a cross-section perpendicular to the cross-section of FIG. 18B.

FIG. 18A shows a top-down view of a fabrication stage 1800 in which an airgap spacer material 1802 is deposited in the upper sidewall region vacated during the sixteenth fabrication stage 1700. FIG. 18B shows a cross-gate view looking into a cross-section of the gate of the FinFET during the fabrication stage of FIG. 18A. FIG. 18C shows a fin-aligned view looking into a cross-section perpendicular to the cross-section of FIG. 18B. The airgap spacer material 1802 is deposited over the metal gate 1502 and forms voids or airgaps 1804 in the sidewall regions between the metal gate 1502 and the proximate trench contacts 1602. In other embodiments related to the sidewalls of FIGS. 17D-F, the spacer material 1802 forms a cap over the sidewalls. Therefore, the completed sidewall spacer includes a lower portion that includes the SiCO material and an upper spacer section that includes a sidewall with an airgap. Chemical mechanical polishing can be performed to provide a level surface between the cap 1802 and the trench contacts 1602.

Figure 19A:
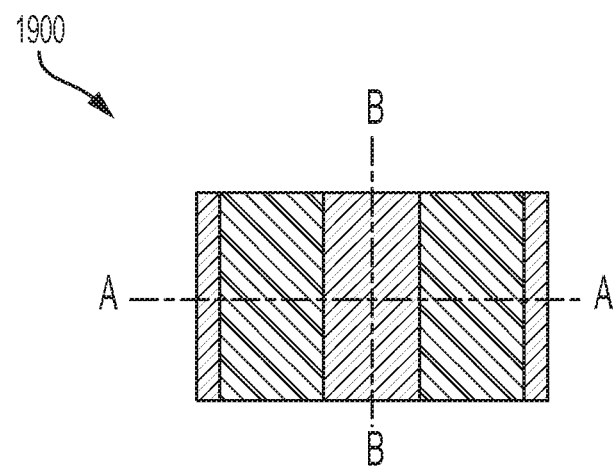
FIG. 19A shows an top-down view of a fabrication stage in which the source and drain connectors are formed.
Figure 19B:
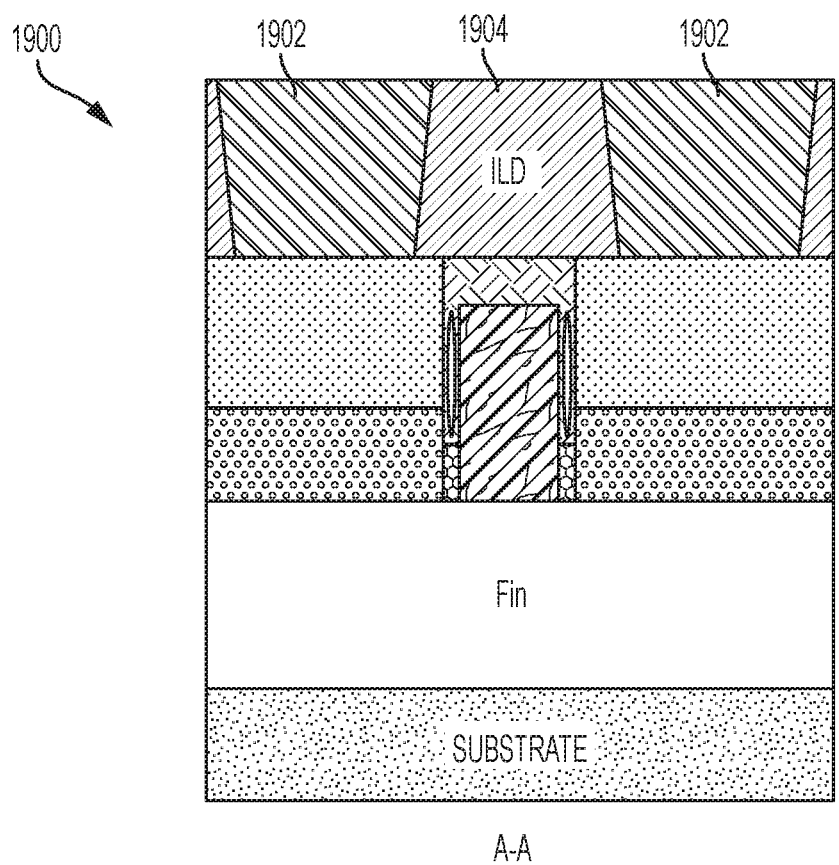
FIG. 19B shows a cross-gate view looking into a cross-section of the gate of the FinFET during the fabrication stage of FIG. 19A.
Figure 19C:
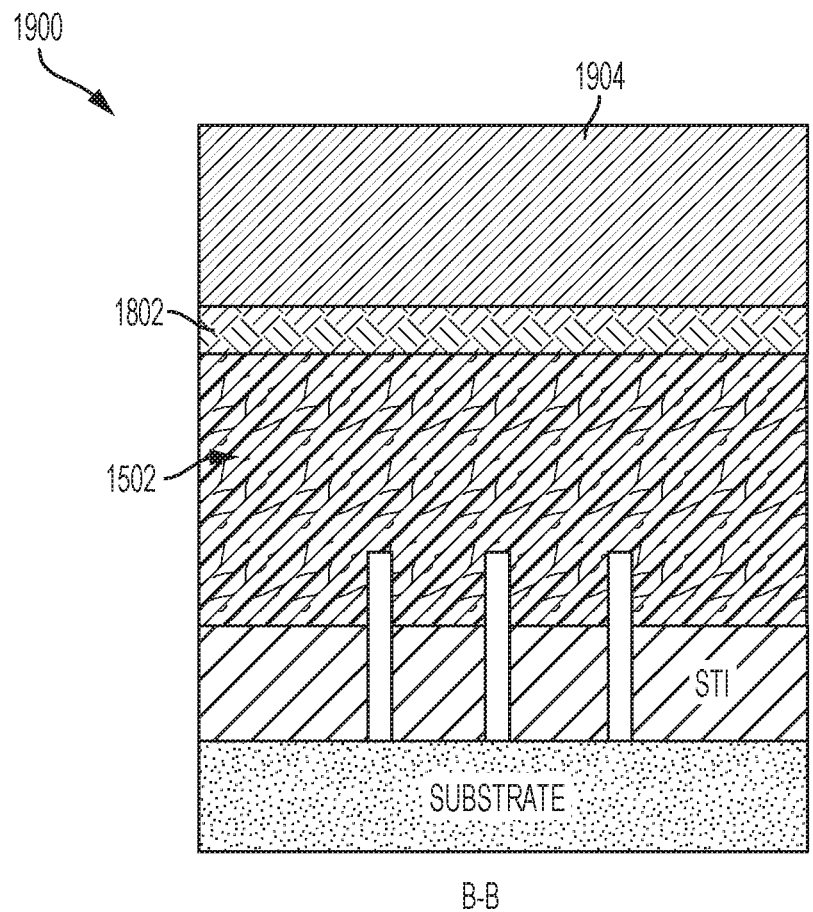
FIG. 19C shows a fin-aligned view looking into a cross-section perpendicular to the cross-section of FIG. 19B.

FIG. 19A shows a top-down view of a fabrication stage 1900 in which the source and drain connectors 1902 are formed. FIG. 19B shows a cross-gate view looking into a cross-section of the gate of the FinFET during the fabrication stage of FIG. 19A. FIG. 19C shows a fin-aligned view looking into a cross-section perpendicular to the cross-section of FIG. 19B. An ILD layer 1904 is formed over the gate and source and drain contacts in order to seal the transistor.

Figure 20:
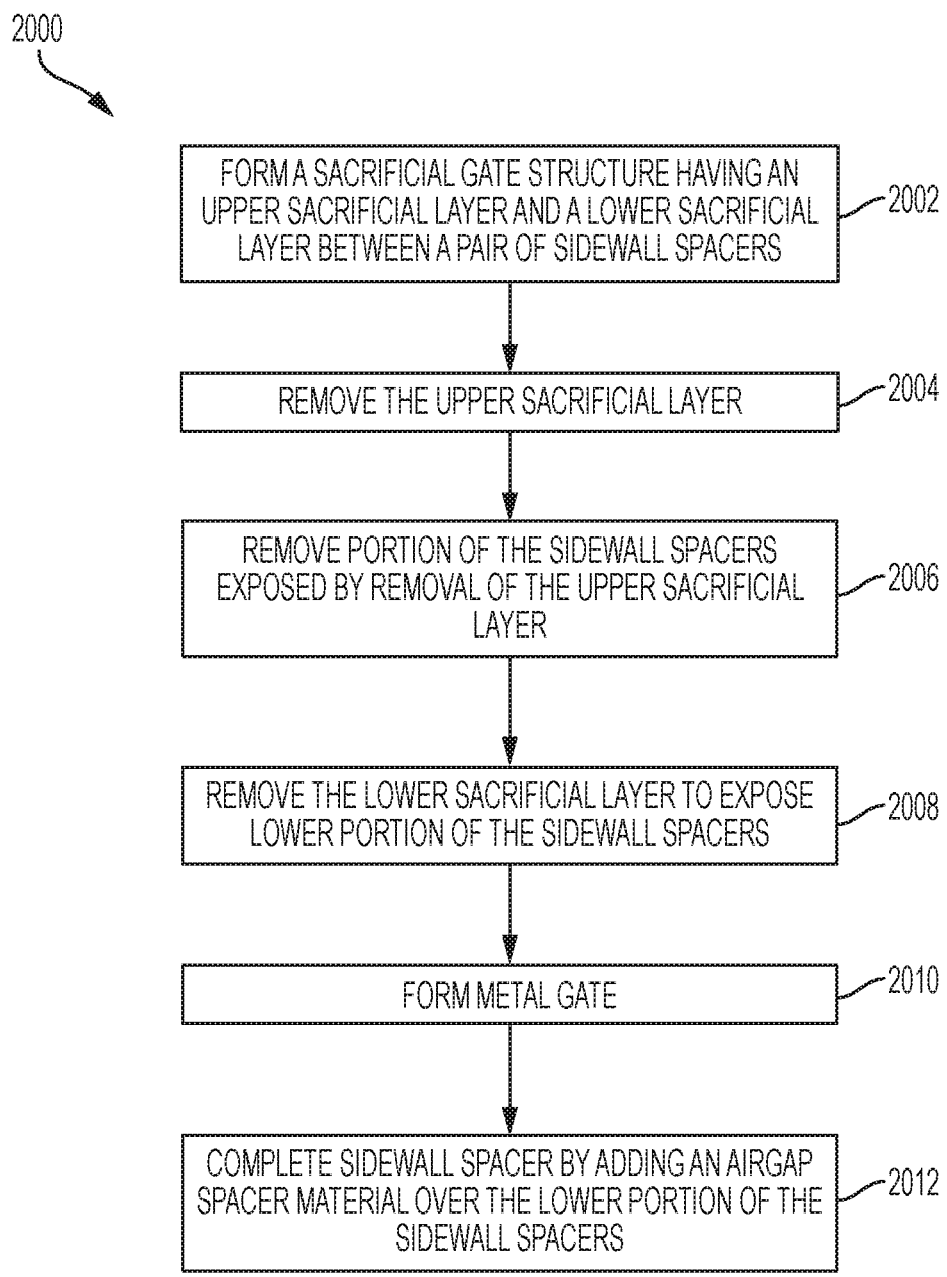
FIG. 20 shows a flowchart illustrating a method of forming an airgap sidewall spacer for FinFET according to an embodiment of the present invention.

FIG. 20 shows a flowchart 2000 illustrating a method of forming an airgap sidewall spacer for FinFET according to an embodiment of the present invention. In box 2002, a sacrificial gate is formed having an upper sacrificial layer and a lower sacrificial layer. The sacrificial gate is formed between a pair of sidewall spacers made of a selected material (e.g., SiCO). In box 2004, the upper sacrificial layer is removed to expose upper portions of the sidewall spacers. In box 2006, the exposed portions of the sidewall spacers are removed, leaving a lower portion of the sidewall spacers that is associated with the lower sacrificial layer. In box 2008, the lower sacrificial layer is removed to expose the lower portion of the sidewall spacers. In box 2010, a metal gate is formed. The metal gate can be formed in the gate area defined by the lower portion of the sidewall spacers. A temporary sidewall spacer material is formed on top of the lower portion in order to extend the length of the sidewall spacers for the purposes of forming the metal gate. The temporary sidewall spacer material is then removed, leaving behind the lower portion of the sidewall spacers (i.e., the SiCO material) that serves as an etch stop when removing the temporary sidewall spacer material In box 2012, the sidewall spacer is completed by adding an airgap material on top of the lower portion of the sidewalls spacers.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for fabricating an air gap spacer in a FinFET, the method comprising:
    depositing a sacrificial gate structure in a gate region, the sacrificial gate structure having an upper sacrificial layer, a lower sacrificial layer, and an etch stop layer between the upper sacrificial layer and the lower sacrificial layer;
    removing the upper sacrificial layer selective to the etch stop layer to expose a sidewall spacer region; and
    depositing an airgap spacer material in the exposed sidewall spacer region to form an upper portion of a sidewall spacer, the upper portion having the air gap.

2. The method of claim 1 further comprising removing the lower sacrificial layer, and filling the gate with gate material.

3. The method of claim 2 further comprising depositing the airgap spacer material in the sidewall spacer region adjacent the gate material.

4. The method of claim 1 further comprising separating the upper sacrificial layer and lower sacrificial layer using a layer of silicon nitride.

5. The method of claim 1 wherein the upper sacrificial layer and the lower sacrificial layer include amorphous silicon.

6. The method of claim 5, wherein the sacrificial gate structure is confined by a first sidewall spacer material, further comprising removing an upper portion of the first sidewall spacer material exposed by removal of the upper sacrificial layer material and retaining an unexposed lower portion of the sidewall spacer.

7. The method of claim 6, further comprising depositing a temporary airgap spacer material on top of the lower portion of the sidewall spacer to form the upper portion of the sidewall spacer.

8. The method of claim 7, wherein the temporary airgap spacer material includes one of: (i) an inner sacrificial layer and an outer etch-resistant layer; (ii) an inner etch-resistant layer and an outer sacrificial layer; and (iii) a sacrificial layer sandwiched between two etch-resistant layer, further comprising removing the sacrificial layer to form an airgap for the airgap spacer material.

9. A method for fabricating a FinFET, the method comprising:
    depositing a sacrificial gate structure to mark a gate region of the FinFET, the sacrificial gate structure having an upper sacrificial layer, a lower sacrificial layer, and an etch stop layer between the upper sacrificial layer and the lower sacrificial layer;
    removing the upper sacrificial layer selective to the etch stop layer to expose an upper portion of a sidewall spacer;
    removing the upper portion of the sidewall spacer; and
    depositing an air gap spacer material in a region vacated by removal of the upper portion of the sidewall spacer.

10. The method of claim 9 further comprising removing the lower sacrificial layer and filling the gate region with gate material.

11. The method of claim 10 further comprising depositing the airgap spacer material in the sidewall spacer region adjacent the gate material.

12. The method of claim 9 further comprising separating the upper sacrificial layer and lower sacrificial layer via a layer of silicon nitride.

13. The method of claim 9, wherein the upper sacrificial layer and the lower sacrificial layer include amorphous silicon.

14. The method of claim 9, wherein the sacrificial gate structure is confined by a first sidewall spacer material, wherein the method further comprises removing an upper portion of the first sidewall spacer material exposed by removal of the upper sacrificial layer material and retaining an unexposed lower portion of the sidewall spacer.

15. The method of claim 14 further comprising depositing the airgap spacer material on top of the lower portion of the sidewall spacer to form the upper portion of the sidewall spacer.

* * * * *